United States Patent
Tu et al.

(10) Patent No.: US 11,520,246 B1
(45) Date of Patent: Dec. 6, 2022

(54) HIGHLY EFFICIENT AUTOMATIC PARTICLE CLEANER METHOD FOR EUV SYSTEMS

(71) Applicant: TAIWAN SEMICONDUCTOR MANUFACTURING COMPANY, LTD., Hsinchu (TW)

(72) Inventors: Shih-Yu Tu, Zhubei (TW); Shao-Hua Wang, Taoyuan (TW); Yen-Hao Liu, Hsinchu (TW); Chueh-Chi Kuo, Kaohsiung (TW); Li-Jui Chen, Hsinchu (TW); Heng-Hsin Liu, New Taipei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/461,456

(22) Filed: Aug. 30, 2021

(51) Int. Cl.
*G03F 7/20* (2006.01)

(52) U.S. Cl.
CPC .............................. *G03F 7/70925* (2013.01)

(58) Field of Classification Search
CPC ............. G03F 7/70916; G03F 7/70933; G03F 7/70925
See application file for complete search history.

(56) References Cited

U.S. PATENT DOCUMENTS

| | | | |
|---|---|---|---|
| 6,327,021 B1 * | 12/2001 | Higashiguchi | G03F 1/84 355/30 |
| 6,543,513 B1 | 4/2003 | Lau et al. | |
| 8,796,666 B1 | 8/2014 | Huang et al. | |
| 9,093,530 B2 | 7/2015 | Huang et al. | |
| 9,184,054 B1 | 11/2015 | Huang et al. | |
| 9,256,123 B2 | 2/2016 | Shih et al. | |
| 9,529,268 B2 | 12/2016 | Chang et al. | |
| 9,548,303 B2 | 1/2017 | Lee et al. | |
| 9,618,837 B2 | 4/2017 | Lu et al. | |
| 9,869,928 B2 | 1/2018 | Huang et al. | |
| 9,869,934 B2 | 1/2018 | Huang et al. | |
| 9,869,939 B2 | 1/2018 | Yu et al. | |
| 2003/0159712 A1 * | 8/2003 | Blattner | H01L 21/67028 134/2 |
| 2007/0258072 A1 * | 11/2007 | Nagasaka | G03F 7/7085 355/53 |
| 2009/0033889 A1 * | 2/2009 | Bleeker | G03F 7/70925 355/30 |

FOREIGN PATENT DOCUMENTS

| | | | |
|---|---|---|---|
| CN | 112015051 A | * | 12/2020 |
| KR | 20070055722 A | * | 5/2007 |

* cited by examiner

*Primary Examiner* — Peter B Kim
(74) *Attorney, Agent, or Firm* — McDermott Will & Emery LLP

(57) ABSTRACT

In a method of cleaning a lithography system, during idle mode, a stream of air is directed, through a first opening, into a chamber of a wafer table of an EUV lithography system. One or more particles is extracted by the directed stream of air from surfaces of one or more wafer chucks in the chamber of the wafer table. The stream of air and the extracted one or more particle are drawn, through a second opening, out of the chamber of the wafer table.

19 Claims, 16 Drawing Sheets

HIGHLY EFFICIENT AUTOMATIC PARTICLE CLEANER METHOD FOR EUV SYSTEMS

BACKGROUND

During an integrated circuit (IC) design, a number of patterns of the IC, for different steps of IC processing, are generated on a substrate, e.g., a wafer. The patterns may be produced by projecting, e.g., imaging, layout patterns of a photo mask on a photo resist layer of the substrate. A lithographic process transfers the layout patterns of the photo masks to the photo resist layer of the substrate such that etching, implantation, or other steps are applied only to predefined regions of the substrate. The lithographic process is performed by a lithography system, e.g., an extreme ultraviolet (EUV) lithography system. In addition to a radiation source, e.g., an EUV radiation source, the components of the lithography system includes a mask handling system, an exposure device for projecting the photo mask to a wafer, and a wafer table including one or more chucks for aligning and holding the wafers during the projection of the photo mask. Transferring the wafers into a lithography system and also transferring the photo masks into the mask handling system may cause particles and organic material contamination to enter the components of the lithography system. The particles and the organic material contamination in the wafer table, the exposure device, and the mask handling system, may cause non-uniformity in the critical dimension (CD) of the resist patterns generated on the wafer. Therefore, cleaning the components of the lithography system is regularly performed, for example, during a preventive maintenance. It is desirable to use a method and system that more rapidly performs the cleaning of the components of the lithography system.

BRIEF DESCRIPTION OF THE DRAWING

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
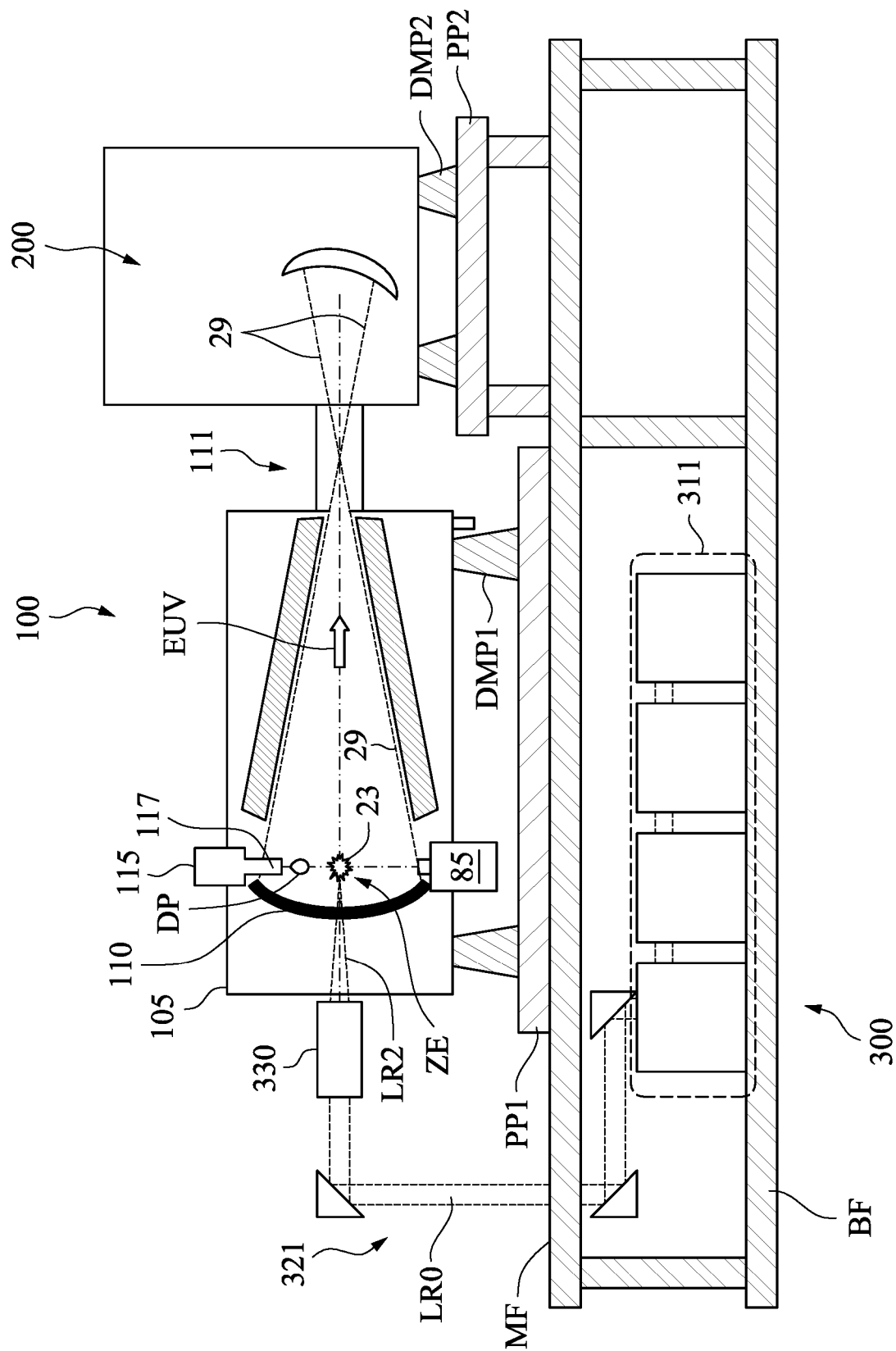
FIG. 1 shows a schematic view of an EUV lithography system with a laser produced plasma (LPP) EUV radiation source.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

In some embodiments, in a lithography system, e.g., an EUV lithography system, a beam of EUV radiation is generated by an EUV radiation source and the beam of EUV radiation is directed to an exposure device for projecting layout patterns of photo masks onto photo resist layers disposed on one or more wafers. In some embodiments, the exposure device includes or is coupled to a mask handling system that includes a mask holding mechanism, e.g., a mask stage. The mask handling system receives a photo mask and mounts the photo mask on the mask stage or alternatively removes the photo mask from the mask stage and transfers the photo mask out of the lithography system. The exposure device also includes optical components, e.g., mirrors and/or lenses, for projecting the beam of EUV radiation onto the photo mask, e.g., a reflective photo mask. The exposure device further includes optical components for projecting the layout patterns of the photo mask onto a photo resist layer of a wafer.

In some embodiments, the exposure device includes or is coupled to a wafer table. The wafer table includes one or more wafer stages for holding the wafers when the optical components of the exposure device projects the layout patterns of the photo mask on the photo resist layer of the wafer. Wafer tables include wafer handling mechanisms, e.g., wafer handling robots, for transferring wafers in and out of the wafer tables and for transferring wafers between the wafer stages. In some embodiments, a wafer stage of the wafer table is used for pre-aligning the wafer and then the wafer is transferred by the wafer handling robot to another wafer stage for projecting the layout patterns of the photo mask onto the photo resist layer of the wafer. In some embodiments, the wafer is transferred by the wafer handling robot out of the wafer table for development of the photo resist pattern on the wafer.

Transferring photo masks into the mask handling system and transferring the wafers into the wafer table may bring particles and organic material contamination into the mask handling system, the wafer table, and also into the exposure device. Thus, the mask handling system, the wafer table, and also the exposure device are regularly cleaned, e.g., during a preventive maintenance (PM), from the particles and the organic material contamination. In some embodiments, the mask handling system and the components of the mask handling system, e.g., the mask stage, the wafer table and the components of the wafer table, e.g., the wafer chucks and the wafer handling robot, and also the exposure device, e.g., the optical components of the exposure device, are manually cleaned. After the cleaning, the components of the wafer table, the mask handling system, and the exposure device may need recalibration. In addition, the wafer table, the mask handling system, and the exposure device may need pressure and temperature stabilization after the cleaning. Thus, the cleaning of the wafer table, the mask handling system, and the exposure device may take between 12 to 36 hours during a monthly PM that may reduce the available time of the lithography system by up to 5 percent and may provide 95 percent available time. In some embodiment in addition to the organic material, organic gas, acid gas, and base gas enter and, thus, contaminate the devices of the lithography system.

In some embodiments, the wafer table, the mask handling system, and the exposure device are not manually cleaned and thus recalibrations of the components are not required. In some embodiments, a directed jet of air or a cleaning gas enters the wafer table, the mask handling system, and the exposure device. The directed jet of air or the cleaning gas enters at one or more entrance locations into the chambers of the wafer table, the mask handling system, and the exposure device. In some embodiments, the directed jet of air or the cleaning gas is a pressurized jet. The directed jet of air or the cleaning gas impinges on the components of the wafer table, the mask handling system, and the exposure device and removes the particles or decompose the organic material contamination from the components of the wafer table, the mask handling system, and the exposure device. The entered air or cleaning gas is extracted, e.g., sucked out, of the chambers of the wafer table, the mask handling system, and the exposure device at one or more exit locations of the chambers. The extracted air or cleaning gas that includes the particles and the organic material contamination passes through different layers of filters that remove the organic material contamination and different sizes of the particles. The above method may improve the available time of the lithography system from 95 percent to 97.5 percent and, thus, may add 2.5 percent to the available time of the lithography system.

FIG. 1 shows a schematic view of an EUV lithography system with a laser produced plasma (LPP) EUV radiation source. The EUV lithography system includes an EUV radiation source 100 (an EUV light source) to generate EUV radiation, an exposure device 200, such as a scanner, and an excitation laser source 300. As shown in FIG. 1, in some embodiments, the EUV radiation source 100 and the exposure device 200 are installed on a main floor MF of a clean room, while the excitation laser source 300 is installed in a base floor BF located under the main floor. Each of the EUV radiation source 100 and the exposure device 200 are placed over pedestal plates PP1 and PP2 via dampers DMP1 and DMP2, respectively. The EUV radiation source 100 and the exposure device 200 are coupled to each other by a coupling mechanism, which may include a focusing unit 111. In some embodiments, a lithography system includes the EUV radiation source 100 and the exposure device 200.

The lithography system is an EUV lithography system designed to expose a resist layer by EUV light (also interchangeably referred to herein as EUV radiation). The resist layer is a material sensitive to the EUV light. The EUV lithography system employs the EUV radiation source 100 to generate EUV light, such as EUV light having a wavelength ranging between about 1 nm and about 50 nm. In one particular example, the EUV radiation source 100 generates an EUV light with a wavelength centered at about 13.5 nm. In the present embodiment, the EUV radiation source 100 utilizes a mechanism of laser-produced plasma (LPP) to generate the EUV radiation.

Figure 2A:
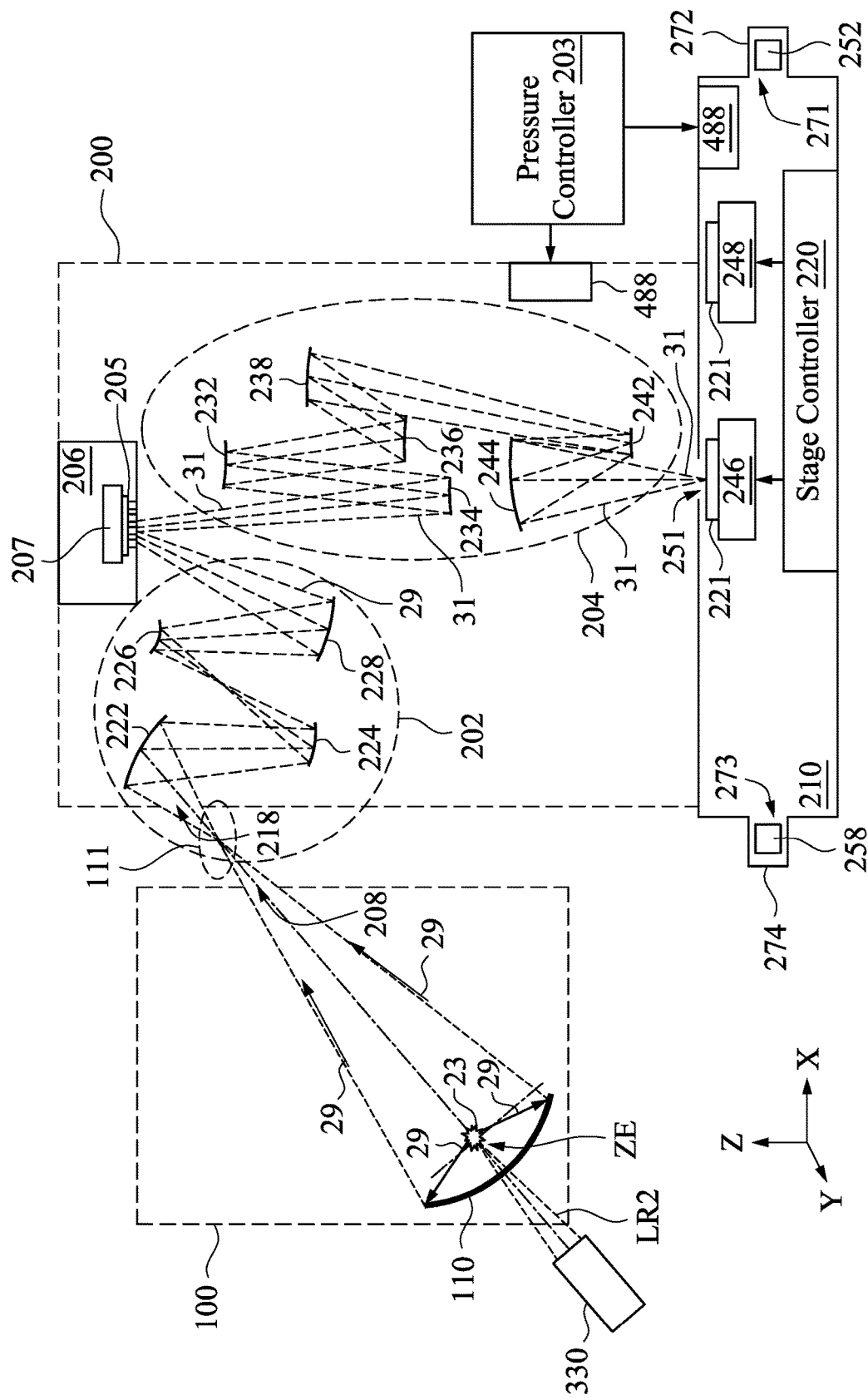
FIGS. 2A and 2B show a schematic diagram an EUV lithography system and the components of the EUV lithography system.

The exposure device 200 includes various reflective optical components, such as convex/concave/flat mirrors, a mask holding mechanism including a mask stage, and wafer holding mechanism, e.g., a substrate holding mechanism or a wafer stage. In some embodiments, the mask stage is included in a mask handling system and the mask handling system, described below with respect to FIG. 2A, is included in or is coupled to the exposure device 200. In some embodiments, the wafer stage is included in a wafer table and the wafer table, described below with respect to FIG. 2A, is included in or is coupled to the exposure device 200. The EUV radiation generated by the EUV radiation source 100 is guided by the reflective optical components onto a mask secured on the mask stage. In some embodiments, the mask stage includes an electrostatic chuck (e-chuck) to secure the mask. Because gas molecules absorb EUV light, the lithography system for the EUV lithography patterning is maintained in a vacuum or a-low pressure environment to avoid EUV intensity loss. The exposure device 200 is described in more details with respect to FIG. 2A. In some embodiments, a reticle is transferred into the exposure device 200. As noted, the exposure device 200 is maintained under a vacuum environment and the reticle is mounted over a substrate. A photo resist layer is disposed over the substrate. The EUV radiation generated by the EUV radiation source 100 is directed by the optical components to project the layout patterns of the mask on the photo resist layer of the substrate. In some embodiments, after the exposure of the layout patterns of the mask on the photo resist layer of the substrate, the reticle is transferred out of the exposure device 200.

In the present disclosure, the terms mask, photomask, and reticle are used interchangeably. In addition, the term resist and photoresist are used interchangeably. In some embodiments, the mask is a reflective mask. In some embodiments, the mask includes a substrate with a suitable material, such as a low thermal expansion material or fused quartz. In various examples, the material includes $TiO_2$ doped $SiO_2$, or other suitable material with low thermal expansion. The mask includes multiple reflective layers (ML) deposited on the substrate. The ML includes a plurality of film pairs, such as molybdenum-silicon (Mo/Si) film pairs (e.g., a layer of molybdenum above or below a layer of silicon in each film pair). Alternatively, the ML may include molybdenum-beryllium (Mo/Be) film pairs, or other suitable materials that are configurable to highly reflect the EUV light. The mask may further include a capping layer, such as ruthenium (Ru), disposed on the ML for protection. The mask further includes an absorption layer, such as a tantalum boron nitride (TaBN) layer, deposited over the ML. The absorption layer is patterned to define a layer of an integrated circuit (IC).

The exposure device 200 includes a projection optics modules for imaging the pattern of the mask on to a semiconductor substrate with a resist coated thereon secured on a substrate stage of the exposure device 200. The projection optics modules generally includes reflective optics. The EUV radiation (EUV light) directed from the mask, carrying the image of the pattern defined on the mask, is collected and directed by the projection optics modules, e.g., mirrors, thereby forming an image of the layout patterns of the photo mask on the resist.

In various embodiments of the present disclosure, the semiconductor substrate is a semiconductor wafer, such as a silicon wafer or other type of wafer to be patterned. The semiconductor substrate is coated with a resist layer sensitive to the EUV light in presently disclosed embodiments. Various components including those described above are integrated together and are operable to perform lithography exposing processes. The lithography system may further include other modules or be integrated with (or be coupled with) other modules.

As shown in FIG. 1, the EUV radiation source 100 includes a droplet generator 115 and a LPP collector mirror 110, enclosed by a chamber 105. The droplet generator 115 generates a plurality of target droplets DP, which are supplied into the chamber 105 through a nozzle 117. In some embodiments, the target droplets DP are tin (Sn), lithium (Li), or an alloy of Sn and Li. In some embodiments, the target droplets DP each have a diameter in a range from about 10 microns (μm) to about 100 μm. For example, in an embodiment, the target droplets DP are tin droplets, each having a diameter of about 10 μm, about 25 μm, about 50 μm, or any diameter between these values. In some embodiments, the target droplets DP are supplied through the nozzle 117 at a rate in a range from about 50 droplets per second (i.e., an ejection-frequency of about 50 Hz) to about 50,000 droplets per second (i.e., an ejection-frequency of about 50 kHz). For example, in an embodiment, target droplets DP are supplied at an ejection-frequency of about 50 Hz, about 100 Hz, about 500 Hz, about 1 kHz, about 10 kHz, about 25 kHz, about 50 kHz, or any ejection-frequency between these frequencies. The target droplets DP are ejected through the nozzle 117 and into a zone of excitation ZE (e.g., a target droplet location) at a speed in a range from about 10 meters per second (m/s) to about 100 m/s in various embodiments. For example, in an embodiment, the target droplets DP have a speed of about 10 m/s, about 25 m/s, about 50 m/s, about 75 m/s, about 100 m/s, or at any speed between these speeds.

The excitation laser beam LR2 generated by the excitation laser source 300 is a pulsed beam. The laser pulses of laser beam LR2 are generated by the excitation laser source 300.

The excitation laser source 300 may include a laser generator 311, laser guide optics 321 and a focusing apparatus 330. In some embodiments, the laser generator 311 includes a carbon dioxide ($CO_2$) or a neodymium-doped yttrium aluminum garnet (Nd:YAG) laser source with a wavelength in the infrared region of the electromagnetic spectrum. For example, the laser source 300 has a wavelength of 9.4 μm or 10.6 μm in an embodiment. The laser light beam LR0 generated by the excitation laser source 300 is guided by the laser guide optics 321 and focused, by the focusing apparatus 330, into the excitation laser beam LR2 that is introduced into the EUV radiation source 100. In some embodiments, in addition to $CO_2$ and Nd:YAG lasers, the laser beam LR2 is generated by a gas laser including an excimer gas discharge laser, helium-neon laser, nitrogen laser, transversely excited atmospheric (TEA) laser, argon ion laser, copper vapor laser, KrF laser or ArF laser; or a solid state laser including Nd:glass laser, ytterbium-doped glasses or ceramics laser, or ruby laser. In some embodiments, a non-ionizing laser beam LR1 (not shown) is also generated by the excitation laser source 300 and the laser beam LR1 is also focused by the focusing apparatus 330 to pre-heat a given target droplet by generating a pre-heat laser pulse.

In some embodiments, the excitation laser beam LR2 includes the pre-heat laser pulse and a main laser pulse. In such embodiments, the pre-heat laser pulse (interchangeably referred to herein as the "pre-pulse) is used to heat (or pre-heat) the given target droplet to create a low-density target plume with multiple smaller droplets, which is subsequently heated (or reheated) by the main laser pulse from the main laser, to generate increased emission of EUV light compared to when the pre-heat laser pulse is not used.

In various embodiments, the pre-heat laser pulses have a spot size about 100 μm or less, and the main laser pulses have a spot size in a range of about 150 μm to about 300 μm. In some embodiments, the pre-heat laser and the main laser pulses have a pulse-duration in the range from about 10 ns to about 50 ns, and a pulse-frequency in the range from about 1 kHz to about 100 kHz. In various embodiments, the pre-heat laser and the main laser have an average power in the range from about 1 kilowatt (kW) to about 50 kW. The pulse-frequency of the excitation laser beam LR2 is matched with the ejection-frequency of the target droplets DP in an embodiment.

The laser beam LR2 is directed through windows (or lenses) into the zone of excitation ZE. The windows adopt a suitable material substantially transparent to the laser beams. The generation of the laser pulses is synchronized with the ejection of the target droplets DP through the nozzle 117. As the target droplets move through the excitation zone, the pre-pulses heat the target droplets and transform them into low-density target plumes. A delay between the pre-pulse and the main pulse is controlled to allow the target plume to form and to expand to an optimal size and geometry. In various embodiments, the pre-pulse and the main pulse have the same pulse-duration and peak power. When the main pulse heats the target plume, a high-temperature plasma plume 23 is generated. The plasma plume 23 emits EUV radiation 29, which is collected by the collector mirror 110. The collector mirror 110, an EUV collector mirror, further reflects and focuses the EUV radiation 29 for the lithography exposing processes performed through the exposure device 200. A droplet DP that does not interact with the laser pulses is captured by the droplet catcher 85. As shown in FIG. 1, the EUV radiation 29 from the collector mirror 110 focuses at the focusing unit 111 between EUV radiation source 100 and the exposure device

200. The EUV radiation 29 that enters from the focusing unit 111 into the exposure device 200 is consistent with EUV radiation that is originated from the focused point, e.g., a point source, in the focusing unit 111.

One method of synchronizing the generation of a pulse (either or both of the pre-pulse and the main pulse) from the excitation laser with the arrival of the target droplet in the zone of excitation is to detect the passage of a target droplet at given position and use it as a signal for triggering an excitation pulse (or pre-pulse). In this method, if, for example, the time of passage of the target droplet is denoted by $t_o$, the time at which EUV radiation is generated (and detected) is denoted by $t_{rad}$, and the distance between the position at which the passage of the target droplet is detected and a center of the zone of excitation is d, the speed of the target droplet, $v_{dp}$, is calculated as $$v_{dp}=d/(t_{rad}-t_o) \qquad \text{equation (1)}.$$

Because the droplet generator 115 is expected to reproducibly supply droplets at a fixed speed, once $v_{dp}$ is calculated, the excitation pulse is triggered with a time delay of $d/v_{dp}$ after a target droplet is detected to have passed the given position to ensure that the excitation pulse arrives at the same time as the target droplet reaches the center of the zone of excitation. In some embodiments, because the passage of the target droplet is used to trigger the pre-pulse, the main pulse is triggered following a fixed delay after the pre-pulse. In some embodiments, the value of target droplet speed $v_{dp}$ is periodically recalculated by periodically measuring $t_{rad}$, if needed, and the generation of pulses with the arrival of the target droplets is resynchronized.

Figure 2B:
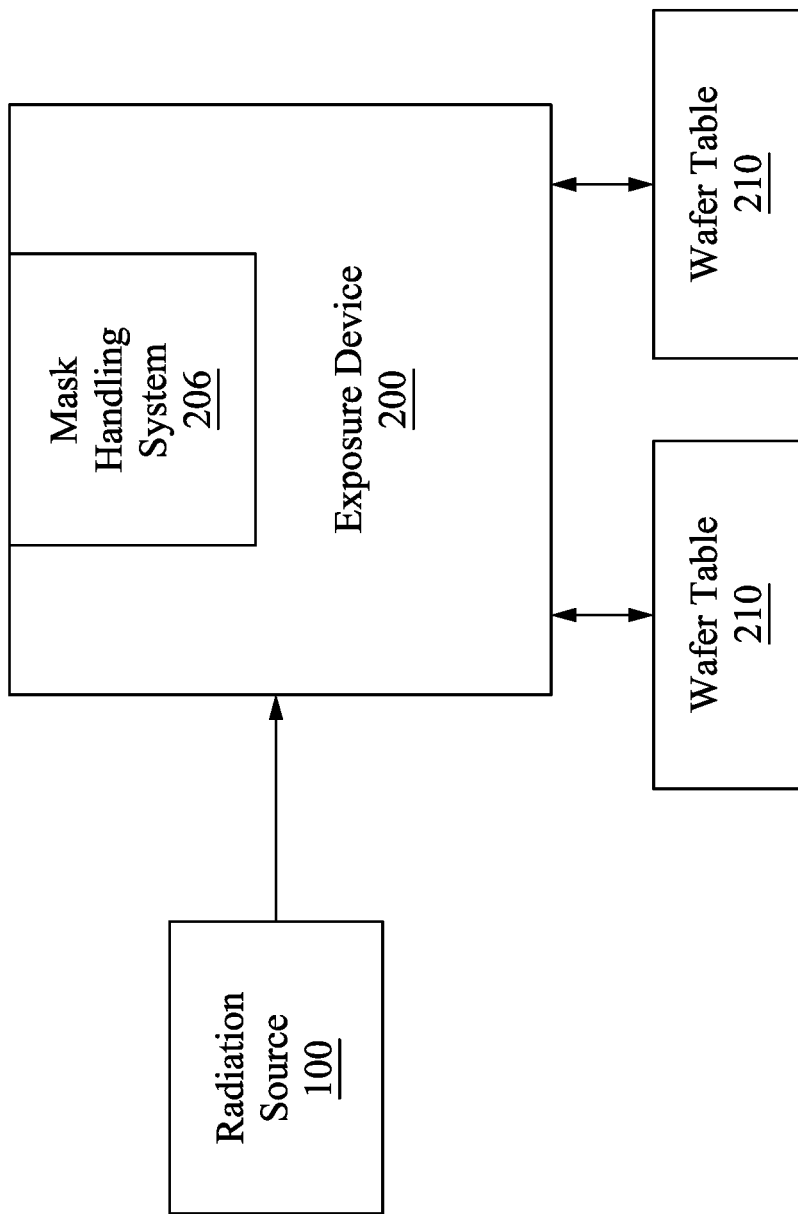

FIGS. 2A and 2B show a schematic diagram an EUV lithography system and the components of the EUV lithography system. FIG. 2A includes the EUV radiation source 100 that produces the beam of EUV radiation 29 by using the focusing apparatus 330 to focus the laser beam LR2 at the zone of excitation ZE to generate the plasma plume 23. Part of the EUV radiation generated by the plasma plume is the EUV radiation 29 that impinges on the collector mirror 110 and reflected from the collector mirror 110 and passes through the focusing unit 111 outside EUV radiation source 100 after exiting the EUV radiation source 100 through an aperture 208 of the EUV radiation source 100. In some embodiments, the aperture 208 is made of a material transparent to EUV radiation.

FIG. 2A also includes the exposure device 200. The exposure device also includes a plurality of convex, concave, or flat mirrors and a mask handling system 206 that includes a mask stage 207. As shown, the EUV radiation 29 is focused by the focusing unit 111 between the EUV radiation source 100 and the exposure device 200 and then enters the exposure device 200 through an aperture 218 of the exposure device 200 and the aperture 218 is made of a material transparent to EUV radiation. After entering the exposure device 200, the EUV radiation 29 is directed by illumination optics 202 to the photo mask 205. As shown, the EUV radiation 29 is directed to a converging mirror 222 of the illumination optics 202 and reflects from the converging mirror 222, is directed to another converging mirror 224 of the illumination optics 202 and reflects from the converging mirror 224, is directed to a diverging mirror 226 of the illumination optics 202 and reflects from the diverging mirror 226, and is directed a flat mirror 228 of the illumination optics 202 and reflects from the flat mirror 228 to impinge on the photo mask 205, e.g., a reflective photo mask, that is mounted on the mask stage 207. The EUV radiation 31 is reflected from the layout patterns of the photo mask 205.

After reflecting from the layout patterns of the photo mask 205, the EUV radiation 31 is directed by projection optics 204 to a wafer 221, e.g., a substrate. As shown, the EUV radiation 31 is directed to a flat mirror 234 of the projection optics 204 and reflects from the flat mirror 234, is directed to a diverging mirror 232 of the projection optics 204 and reflects from the diverging mirror 232, is directed to another diverging mirror 236 of the projection optics 204 and reflects from the diverging mirror 236, is directed to a converging mirror 238 of the projection optics 204 and reflects from the converging mirror 238, is directed to another diverging mirror 242 of the projection optics 204 and reflects from the diverging mirror 242, is directed to another converging mirror 244 of the projection optics 204 and reflects from the converging mirror 244 to impinge on the wafer 221 that is mounted on a wafer stage 246. The exposure device 200 further includes a pressure sensor 488 that is coupled to a pressure controller 203 and the pressure controller 203 is used for maintaining vacuum environment inside the exposure device 200 in some embodiments.

FIG. 2A also includes a wafer table 210 that includes two wafer stages 246 and 248 and a stage controller 220. The wafer table 210 further includes another pressure sensor 488 that is coupled to the pressure controller 203 and the pressure controller 203 is used for maintaining vacuum environment inside the wafer table 210 in some embodiments. The exposure device 200 is optically coupled to the wafer table 210 through an aperture 251 that is made of a material that is transparent to the EUV radiation. In some embodiments, the apertures 208, 218, and 251 block transfer of gas to maintain the pressure inside the exposure device 200 and wafer table 210, however, the apertures 208, 218, and 251 are optically transparent to the EUV radiation. The wafer table 210 further includes a gas blower chamber 272 that is coupled through an opening 271 to a chamber of the wafer table 210 and includes a gas extractor chamber 274 that is coupled through an opening 273 to the chamber of the wafer table 210. The gas blower chamber 272 includes a gas blower system 252, e.g., a first gas conducting system, and the gas extractor chamber includes a gas extractor system 258, e.g., a second gas conducting system.

FIG. 2B shows a systematic view of the EUV lithography system that shows the components of the EUV lithography system. The EUV lithography system of FIG. 2B shows the EUV radiation source 100, the exposure device 200 including the mask handling system 206, and two wafer tables 210. The EUV radiation source 100 that is optically coupled to the exposure device 200, generates the EUV radiation and as described above, directs the EUV radiation to the exposure device. The exposure device 200 is also optically coupled to the wafer tables 210. The exposure device 200 uses the EUV radiation to project the photo mask of the mask handling system 206 to a substrate in the one of the wafer tables 210.

Figure 3:
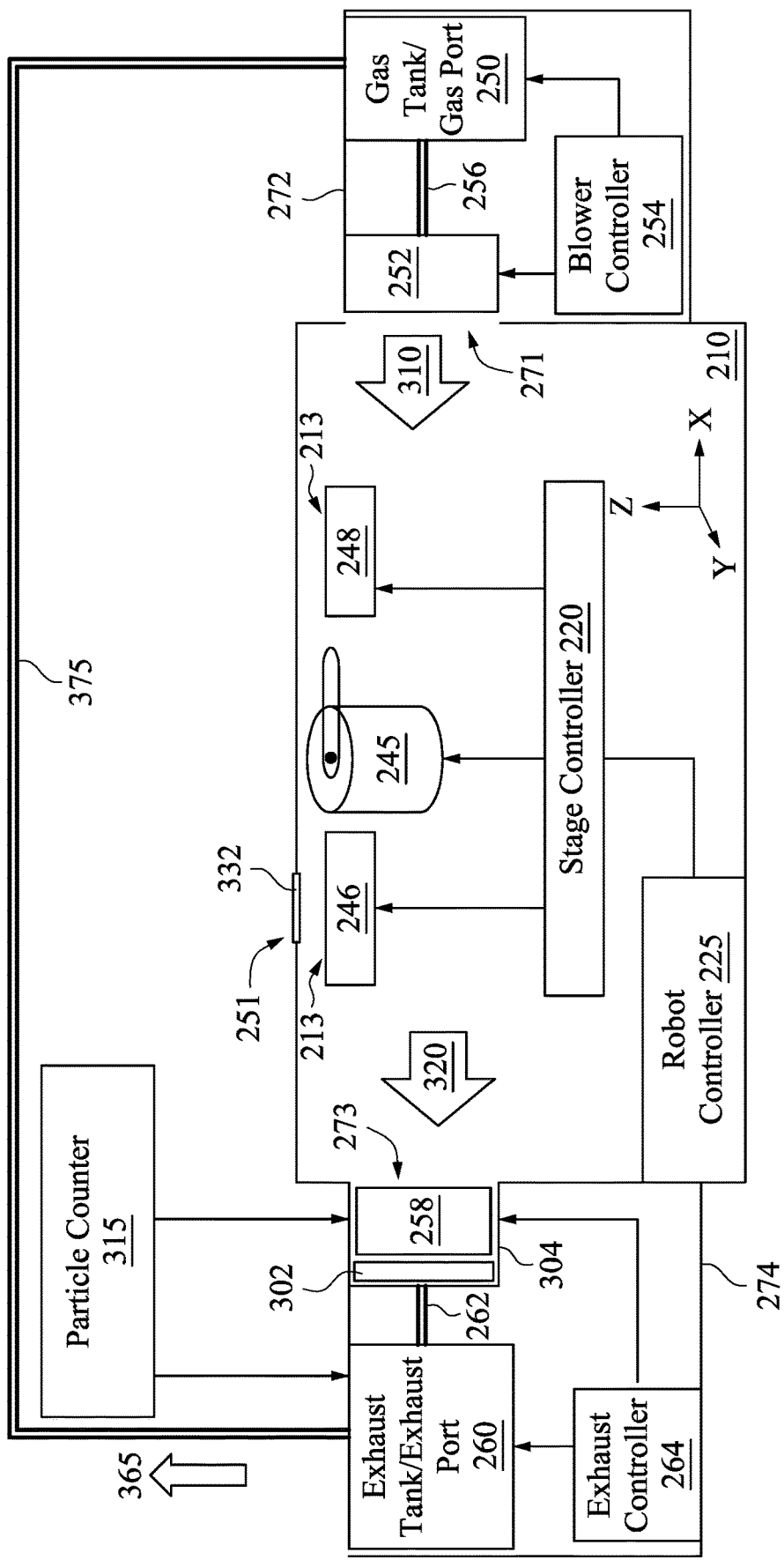
FIG. 3 shows a schematic diagram of a wafer table with a cleaning system in accordance with some embodiments of the present disclosure.

FIG. 3 shows a schematic diagram of a wafer table with a cleaning system in accordance with some embodiments of the present disclosure. FIG. 3 shows the wafer table 210, gas extractor chamber 274, and the gas blower chamber 272. The gas blower chamber 272 is coupled through the opening 271 and the gas extractor chamber 274 is coupled through the opening 273 to the chamber of the wafer table 210. The gas blower chamber 272 includes the gas blower system 252 that is coupled to a blower controller 254 and is controlled by the blower controller 254. The gas blower system 252 is connected via a pipe 256 to a gas tank-gas port 250. The gas tank-gas port 250 includes a gas storage for purge gas and provides one or more purge gasses, via the pipe 256, to the gas blower system 252. The gas tank-gas port 250 is coupled and controlled by the blower controller 254. In some embodiments, the blower controller 254 commands the gas tank-gas port 250 to provide the purge gas to the gas blower system 252 and also commands the gas blower system 252 to generate, e.g., blow, a stream of purge gas 310, through the opening 271, into the chamber of the wafer table 210. In some embodiments, the purge gas is clean dry air, argon, $CO_2$, $NO_x$, hydrogen, neon, xenon, helium or a combination thereof. In some embodiments, the purge gas includes water vapor (deionized water or ionized water), acetone, isopropanol, ethanol, or trichloroethylene. In some embodiments, the purge gas includes HF, $H_2SO_4$, HCl, $H_3PO_4$, $HNO_3$, $CH_3COOH$ or alkaline solution such as $NH_4OH$, KOH, NaOH, or a tertiary amine. In some embodiments, the gas tank-gas port 250 is connected to a gas source of the lithography system and receives the purge gas from the lithography system.

The gas extractor chamber 274 includes the gas extractor system 258 that draws a stream of gas 320, through the opening 273, from the chamber of the wafer table 210 and directs the stream of gas 320 into a filter system 302. In some embodiments, the gas extractor system 258 and the filter system 302 are inside an exhaust purge chamber 304. The exhaust purge chamber is described below with respect to FIG. 6. The exhaust purge chamber 304 is coupled through a pipe 262 to an exhaust port 260. A particle counter 315 is coupled to the exhaust purge chamber 304 and the exhaust port 260 to determine, e.g., to count the number of particles inside the exhaust purge chamber 304 and to determine the number of particles inside the exhaust port 260. Further, an exhaust controller 264 is coupled to the gas extractor system 258 of the exhaust purge chamber 304 and to the exhaust port 260. In some embodiments, the exhaust controller 264 commands the gas extractor system 258 to draw the stream of gas 320 from the chamber of the wafer table 210. In addition, the exhaust controller 264 commands the exhaust port 260 to receive the stream of gas 320, after being filtered by the filter system 302 to purge, e.g., remove the particles from the stream of gas 320, and let the filtered stream of gas 320 to be directed to the exhaust port 260 to generate a stream 365 to exit the gas extractor chamber 274 and return via a pipe 375 to the gas tank-gas port 250. In some embodiments, the one or more filters of the filter system 302 are replaced by unused filters after a period of 3 months, 6 months, or a year. In some embodiments, the one or more filters of the filter system 302 are replaced by unused filters after each preventive maintenance.

As shown in FIG. 3, the chamber of wafer table 210 has components that include wafer stages 246 and 248 with each one of the wafer stages having a wafer chuck 213 installed on the stage. The chamber of wafer table 210 also has a wafer handling robot 245 and the stage controller 220. The wafer chucks 213 receive and hold the wafers 221 that are shown in FIG. 2A from outside the wafer table 210. Thus, the wafer chucks 213, the other components of the wafer table 210, and the chamber of the wafer table may receive particles and the organic material contamination from outside the wafer table 210. The stream of gas 310 blows above, below, and through the components of the wafer table 210 and the stream of gas 310 removes, e.g., extracts, particles that are on the components, e.g., on the exposed surfaces of the components, of the wafer table 210. Thus, the stream of gas 310 removes the particles that are on the components of the wafer table 210 and are on the walls of the chamber of the wafer table 210.

In some embodiments, the extracted particles are carried by the stream of gas 310. The stream of gas 310 moves through the components of the wafer table 210 and becomes the stream of gas 320 that is extracted from the chamber of the wafer table 210 through the opening 273. Thus, the extracted particles are carried by the stream of gas 320 and are drawn, e.g., extracted, from the chamber of the wafer table 210. In some embodiments, the extracted particles are filtered by two or more filters of the filter system 302 such that a first filter removes the large particles and a second filter remove the smaller particles. In some embodiments, the gas blower system 252 and/or the gas extractor system 258 changes the speed of the stream of gas 310 and 320 to improve the extraction of the particles on the components of the wafer table 210. In some embodiments, the aperture 251 of the wafer table 210 where the EUV radiation 31 enters the wafer table 210 is covered by a thin layer 332 of a material that is optically transparent to EUV radiation but does not allow air or gas enter or exit the wafer table through the aperture 251.

Figure 4:
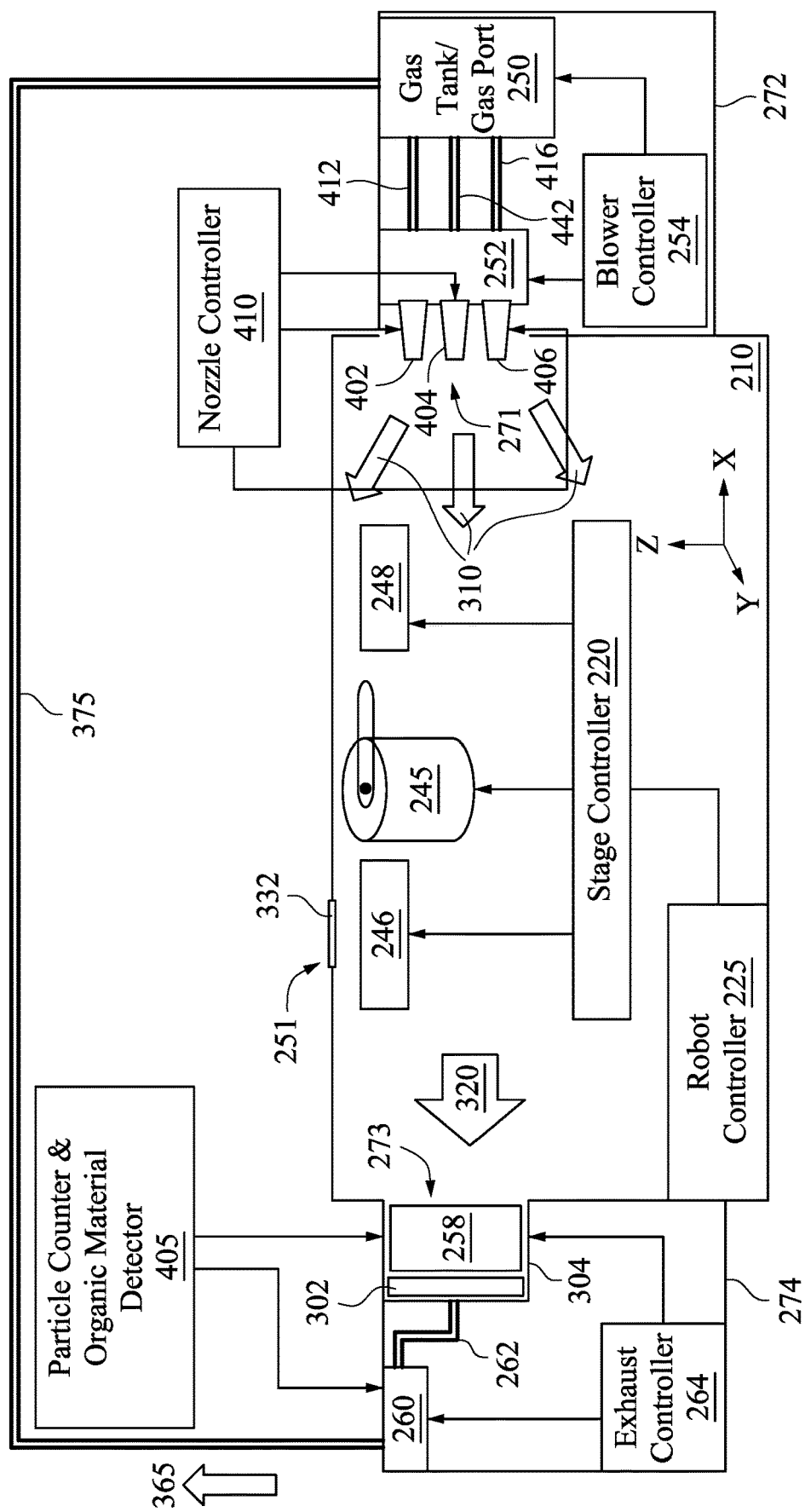
FIG. 4 shows a schematic diagram of a wafer table with a cleaning system in accordance with some embodiments of the present disclosure.

FIG. 4 shows a schematic diagram of a wafer table with a cleaning system in accordance with some embodiments of the present disclosure. FIG. 4 is similar to FIG. 3 with the difference that the gas blower system 252 includes one or more nozzles 402, 404, and 406 and the streams of gas 310 enter the chamber of the wafer table 210 through the nozzles 402, 404, and 406 in the opening 271. The nozzles 402, 404, and 406 are coupled to a nozzle controller 410 such that the nozzle controller may rotate the nozzles 402, 404, and 406 up and down in the Z-direction and, thus, the stream of gas 310 produced by the nozzles 402, 404, and 406 sweep the components and the chamber of the wafer table 210 in the Z-direction. In some embodiments, the nozzle controller 410 rotates or moves the nozzles 402, 404, and 406 in the XY-plane and, thus, the streams of gas 310 produced by the nozzles 402, 404, and 406 sweep the components and the chamber of the wafer table 210 in the Y-direction. The gas tank-gas port 250 of the gas blower chamber 272 provides one or more solvents in addition to the purge gas. In some embodiments, the gas tank-gas port 250 is connected through 3 pipes 412, 442, and 416 to the gas blower system 252. In some embodiments, the pipe 412 provides the purge gas and the pipes 442 and 416 provide one or more vaporized solvents for the gas blower system 252. In some embodiments, the gas tank-gas port 250, e.g., a gas source, includes isopropyl alcohol (IPA), acetone, water, or other similar solvents described above that can dissolve, e.g., decompose, the organic material contamination or help removing the particles on the components or the chamber of the wafer table 210. In some embodiments, hydrogen and/or oxygen radical or ozone is added as solvent to clean carbon compounds. Thus, the stream of gas 310 removes the particles and dissolves the organic material contamination that are on the components of the wafer table 210 and are on the walls of the chamber of the wafer table 210.

In some embodiments, the extracted particles and the dissolved organic material contamination are carried by the stream of gas 310. The stream of gas 310 moves through the components of the wafer table 210 and becomes the stream of gas 320 that is extracted from the chamber of the wafer table 210 through the opening 273. Thus, the extracted particles and the dissolved or decomposed organic material contamination are carried by the stream of gas 320 and are extracted from the chamber of the wafer table 210. In some embodiments, the extracted particles and the dissolved or decomposed organic material contamination is filtered by two or more filters of the filter system 302. In some embodiments, the gas blower system 252 and/or the gas extractor system 258 changes the speed of the stream of gases 310 and 320 to improve the extraction of the particles and the dissolution of the organic material contamination on the components and the chamber of the wafer table 210.

In addition, FIG. 4 shows a particle counter and organic material detector 405 that is coupled to the exhaust purge chamber 304 and the exhaust port 260 of the gas extractor chamber 274 to determine the number of particles and an amount of the organic material inside the exhaust purge chamber 304 and to determine the number of particles and the amount of the organic material inside the exhaust port 260. An exhaust controller 264 is coupled to the gas extractor system 258 of the exhaust purge chamber 304 and to the exhaust port 260. In some embodiments, the exhaust controller 264 commands the gas extractor system 258 to draw the stream of gas 320 from the chamber of the wafer table 210. In addition, the exhaust controller 264 commands the exhaust port 260 to receive the stream of gas 320, after being filtered by the filter system 302 to purge, e.g., remove the particles and organic material from the stream of gas 320, and let the filtered stream of gas 320 to be directed to the exhaust port 260 to generate a stream 365 to exit the gas extractor chamber 274 and return via a pipe 375 to the gas tank-gas port 250. In some embodiments, the extracted particles and the organic material are separately filtered by two or more filters of the filter system 302 such that a first filter removes the organic material and a second filter remove the particles. The components of the gas blower system 252 and the gas extractor system 258 are described with respect to FIGS. 7A, 7B, 7C, 7D and 7E and also FIGS. 8A, 8B, 8C, 8D, 8E, and 8F.

Figure 5A:
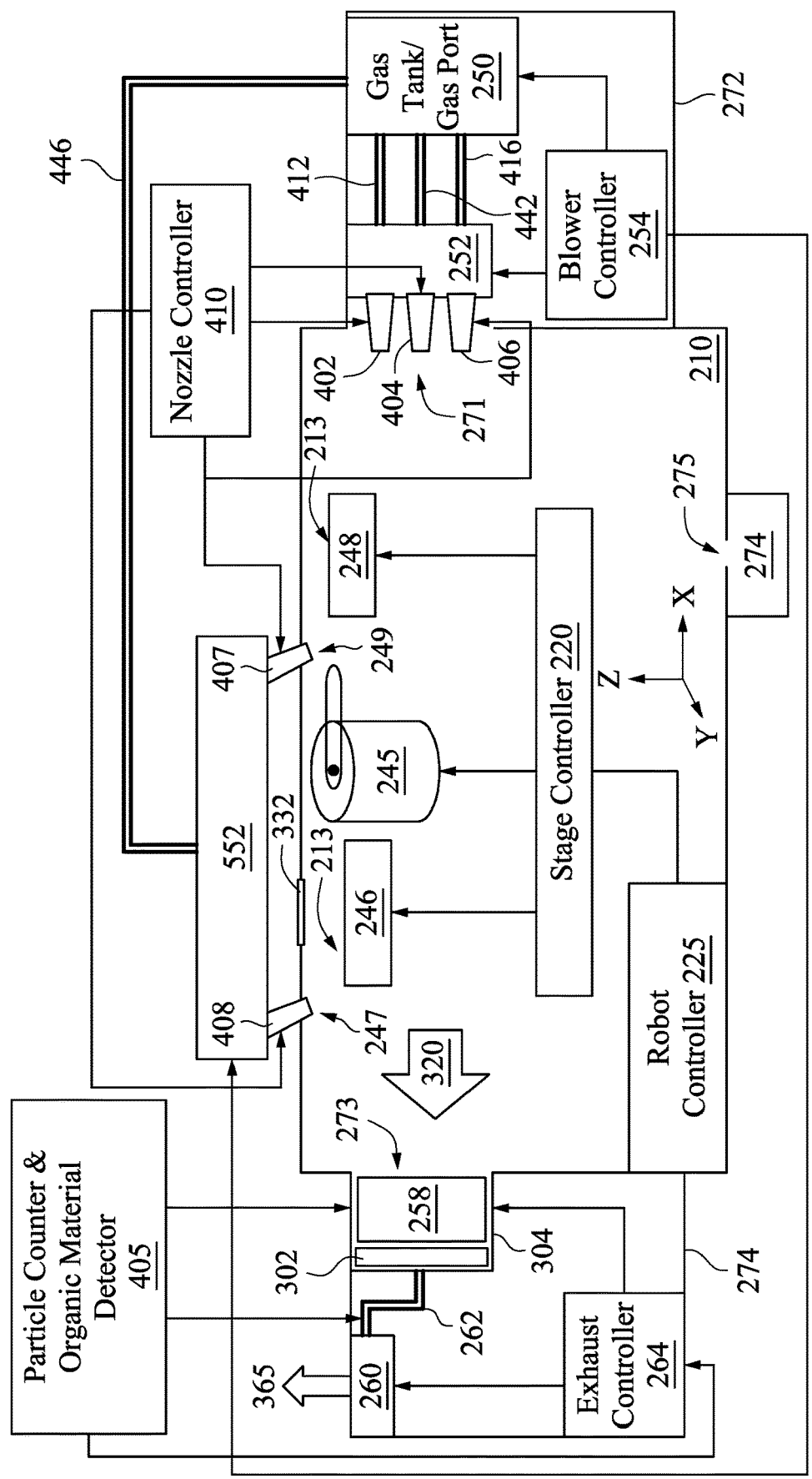
FIGS. 5A, 5B, 5C, 5D, and 5E show schematic diagrams of devices of the EUV lithography system connected to cleaning systems in accordance with some embodiments of the present disclosure.

FIGS. 5A, 5B, 5C, 5D, and 5E show schematic diagrams of devices of the EUV lithography system connected to cleaning systems in accordance with some embodiments of the present disclosure. FIG. 5A is similar to FIG. 4 and the device of the EUV lithography system is a wafer table, however, FIG. 5A additionally has another gas blower system 552. The gas blower system 552 is mounted over the wafer stages 246 and 248. The gas blower system 552 includes at least two nozzles 407 and 408 that are directed to blow from top over the wafer stages 246 and 248 and over the wafer chucks 213 of the wafer stages 246 and 248. The nozzles 407 and 408 are also coupled to and controlled by the nozzle controller 410. In some embodiments, the nozzle controller may rotate tips 247 and 249 of the nozzles 407 and 408 along the X-direction and, thus, the streams of gases that are produced at the tips 247 and 249 of the nozzles 407 and 408 sweep the components and the chamber of the wafer table 210 in the X-direction. The gas blower system 552 is connected via a pipe 446 to the gas tank-gas port 250 and receives the purge gas and solvents via the pipe 446 from the gas tank-gas port 250. The wafer table 210 of FIG. 5A is coupled to a second gas extractor chamber 274 via an opening 275 and, thus, the gas in the chamber of the wafer table 210 is extracted through two gas extractor systems 258 via two openings 273 and 275.

Figure 5B:
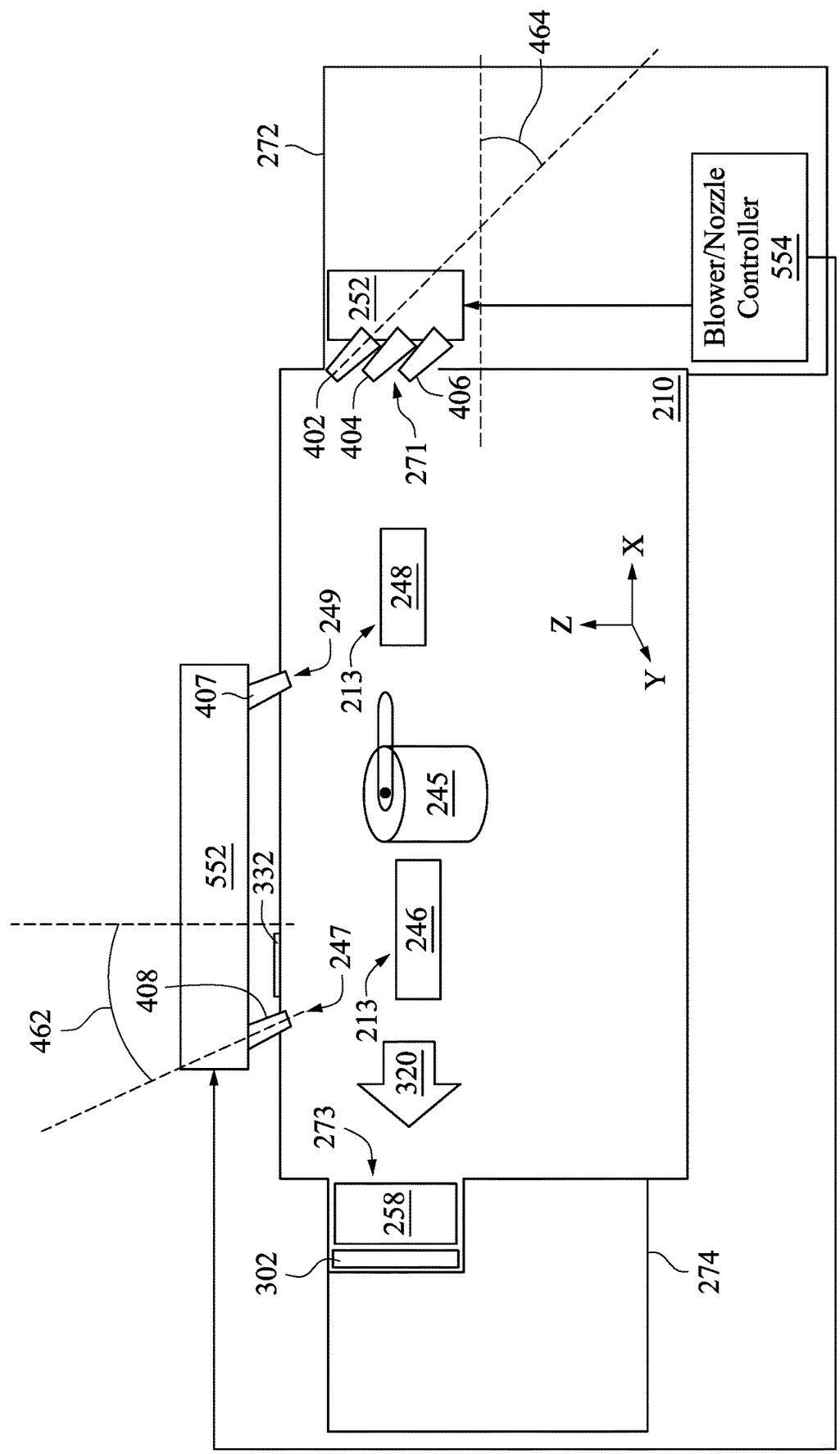

FIG. 5B is similar to FIG. 5A and shows an angle 464 of rotation of the nozzles 402, 404, and 406 with respect to the X-direction and an angle 462 of the rotation of the nozzles 407 and 408 with respect to the Z-direction. In some embodiments, the angle 464 changes between about 85 degrees and about −85 degrees and the gas streams from the nozzles 402, 404, and 406 sweep the components and the chamber of the wafer table 210 in the Z-direction. In some embodiments, the angle 464 is either −45 degrees or +45 degrees. In some embodiments, the angle 462 changes between about 85 degrees and about −85 degrees and the nozzles 407 and 408 sweep the components and the chamber of the wafer table 210 in the X-direction. In some embodiments, the angle 462 is either −45 degrees or +45 degrees. Although not shown, the nozzles 402, 404, and 406 and the nozzles 407 and 408 also rotate along the Y-direction and may sweep the components and the chamber of the wafer table 210 in the Y-direction.

Figure 5C:
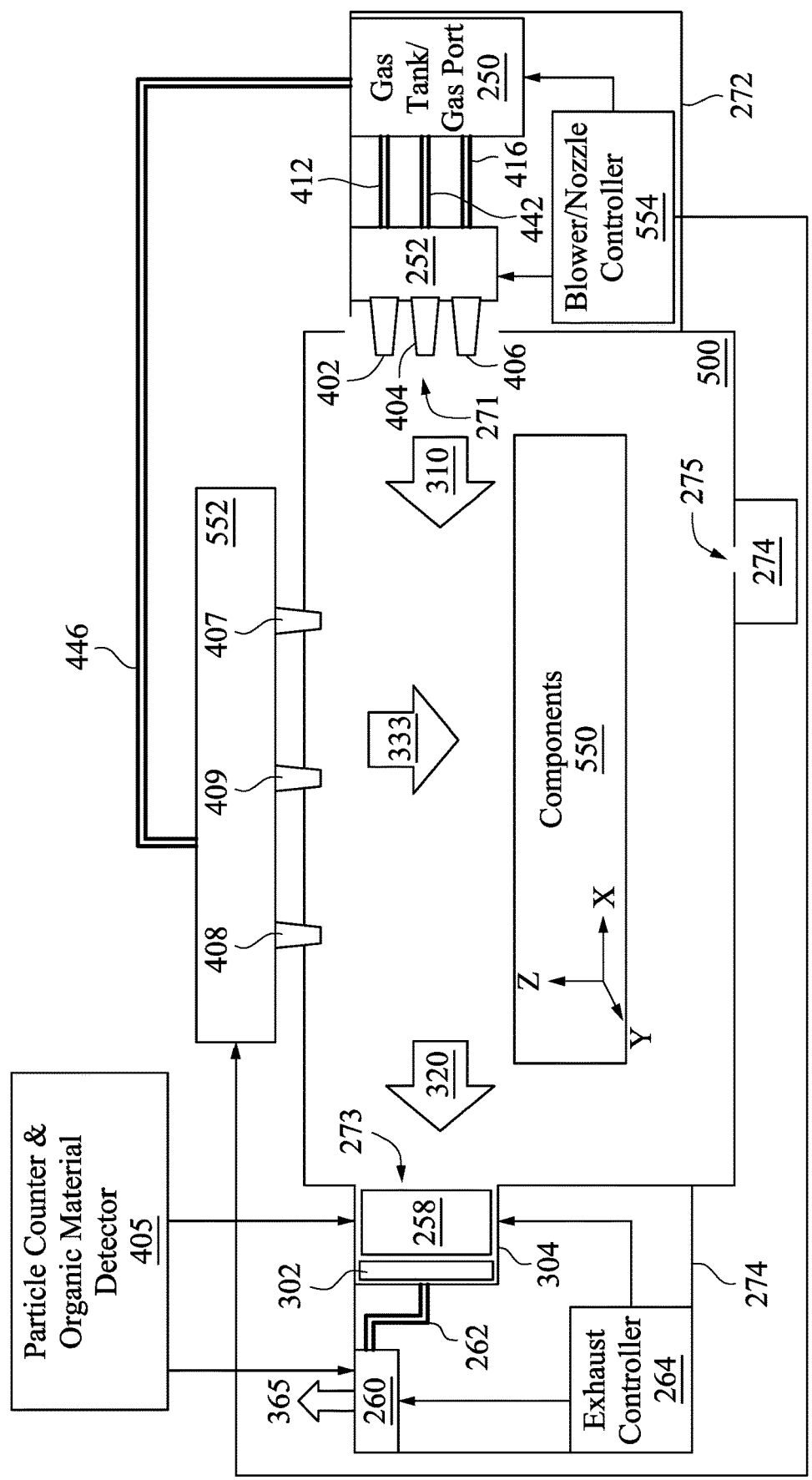

FIG. 5C is similar to FIG. 5A, however, the gas blower system 552 has three nozzles 407, 408, and 409 that produce stream of gas 333. Also, in FIG. 5C, a device 500 is consistent with either a wafer table 210, an exposure device 200, or a mask handling system 206 and components 550 are either the components of wafer table 210, the components of the exposure device 200, or the components of the mask handling system 206. As shown in FIG. 5C, the components and the chambers of the exposure device 200 and the mask handling system 206 are similarly cleaned during the preventive maintenance and, thus, calibration and temperature and pressure stabilization of the exposure device 200 and the mask handling system 206 may not be needed. The blower controller 254 and nozzle controller 410 of FIG. 5A are combined in FIG. 5C to a blower-nozzle controller 554.

Figure 5D:
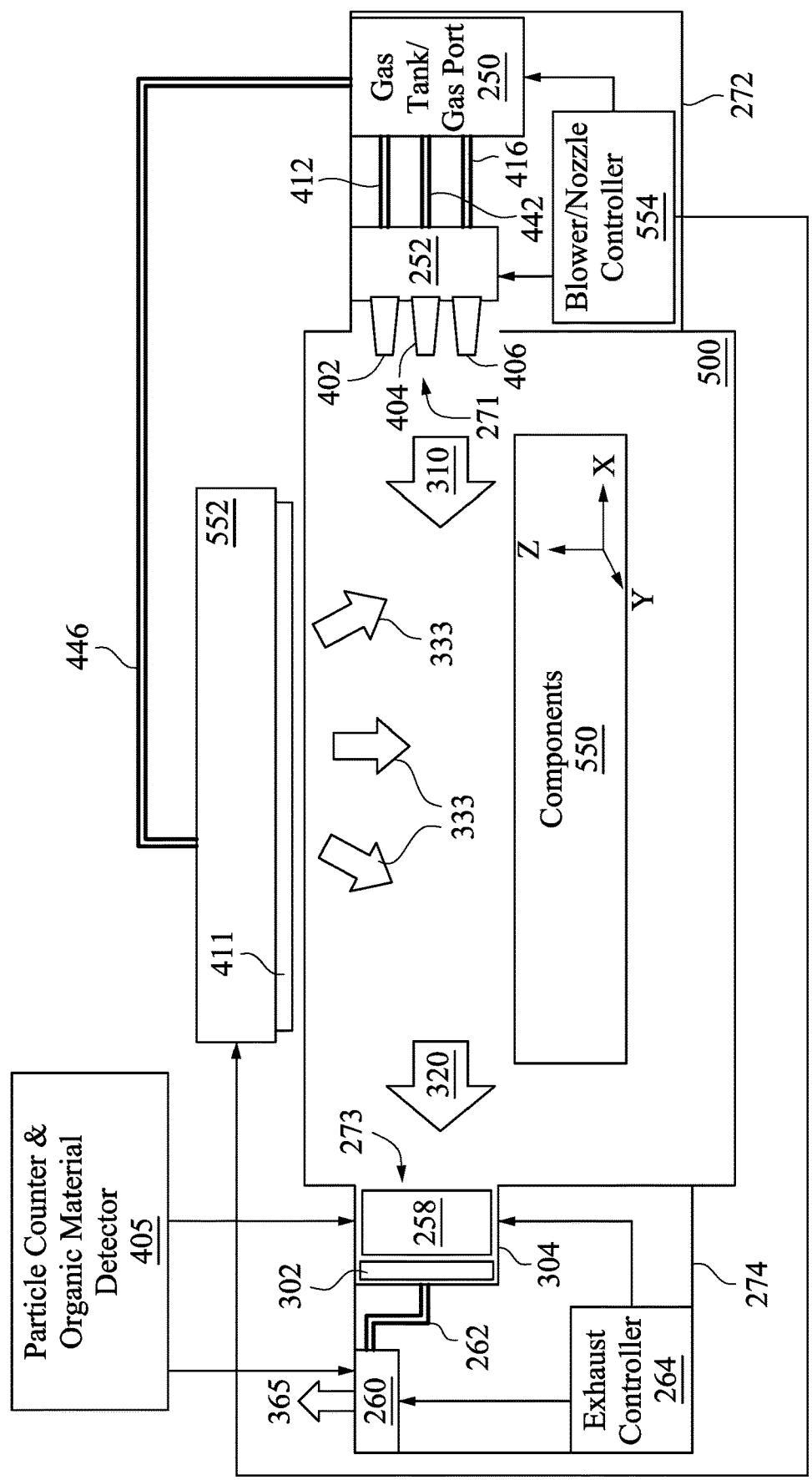

FIG. 5D is similar to FIG. 5C, however, the gas blower system 552 has a linear nozzle 411 that produces a fan shape stream of gas 333. The fan shape stream of gases sweep the components 550 and the chamber of the device 500 in the Y-direction when the linear nozzle 411 rotates along the Y-direction. In addition, the chamber of the device 500 is coupled to one gas extractor chamber 274.

Figure 5E:
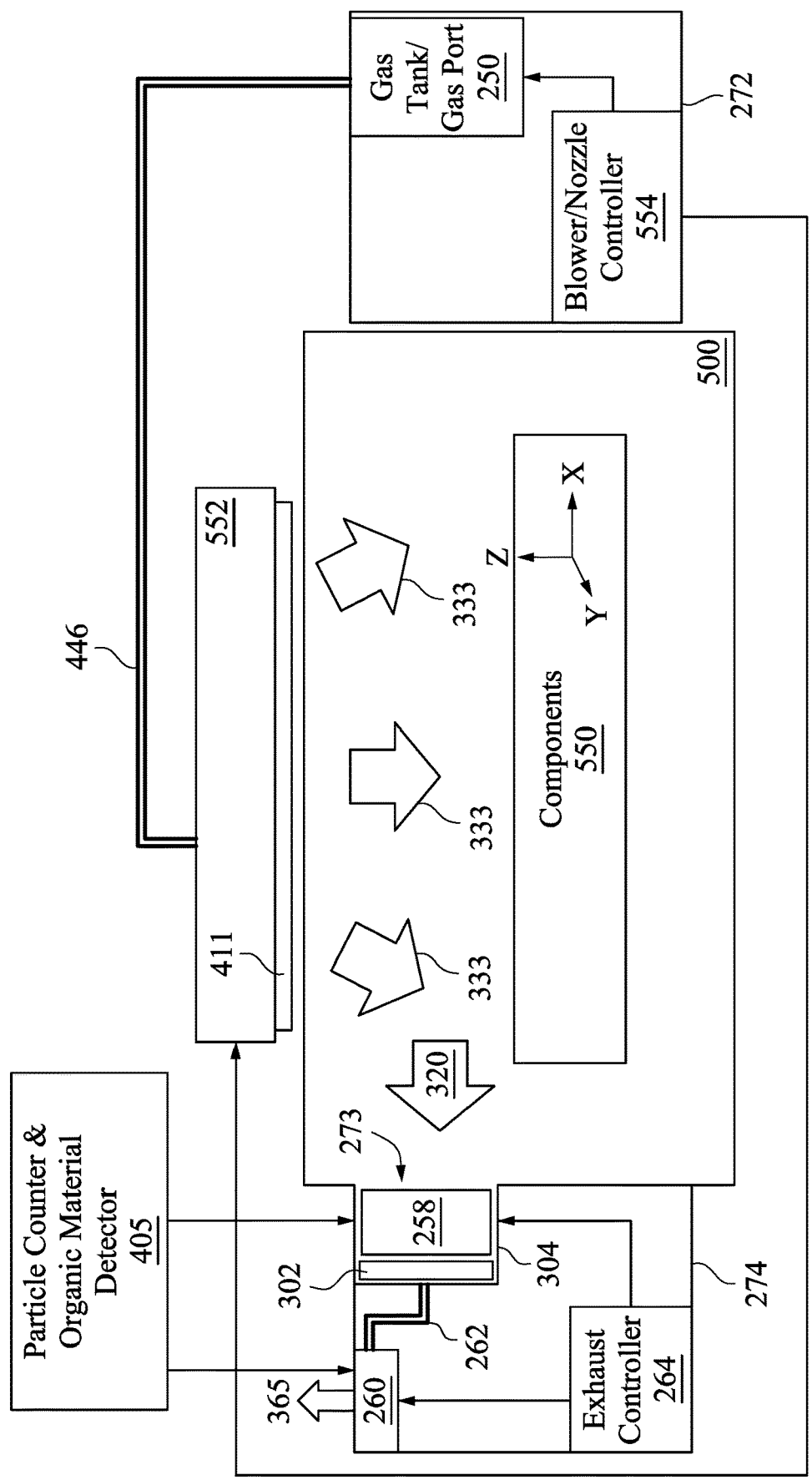

FIG. 5E is similar to FIG. 5D, however, the chamber of the device 500 is only coupled to the gas blower system 552 and is not coupled to the gas blower system 252. In addition, the chamber of the device 500 is coupled to two gas extractor chambers 274. In embodiments of FIGS. 5A-5E, similar to FIGS. 3 and 4, the stream 365 that exits from the gas extractor chamber 274 returns via the pipe 375 to the gas tank-gas port 250 in some embodiments. In some embodiments, the cleaning method described above is performed when the lithography system is in idle mode. In some embodiments, when performing the cleaning method described above, a temperature of the chamber of device 500 is maintained at a temperature essentially close to the temperature of the lithography system during normal operation, e.g., within about +1 degrees Celsius and about −1 degrees Celsius. Thus, the device 500 may not need temperature stabilization after the cleaning. In some embodiments, when performing the cleaning method described above, a pressure of the chamber of device 500 is maintained at a pressure essentially close to the pressure of the lithography system during normal operation, e.g., within about +10 Torr and about −10 Torr. Thus, the device 500 may not need pressure stabilization after the cleaning.

Figure 6:
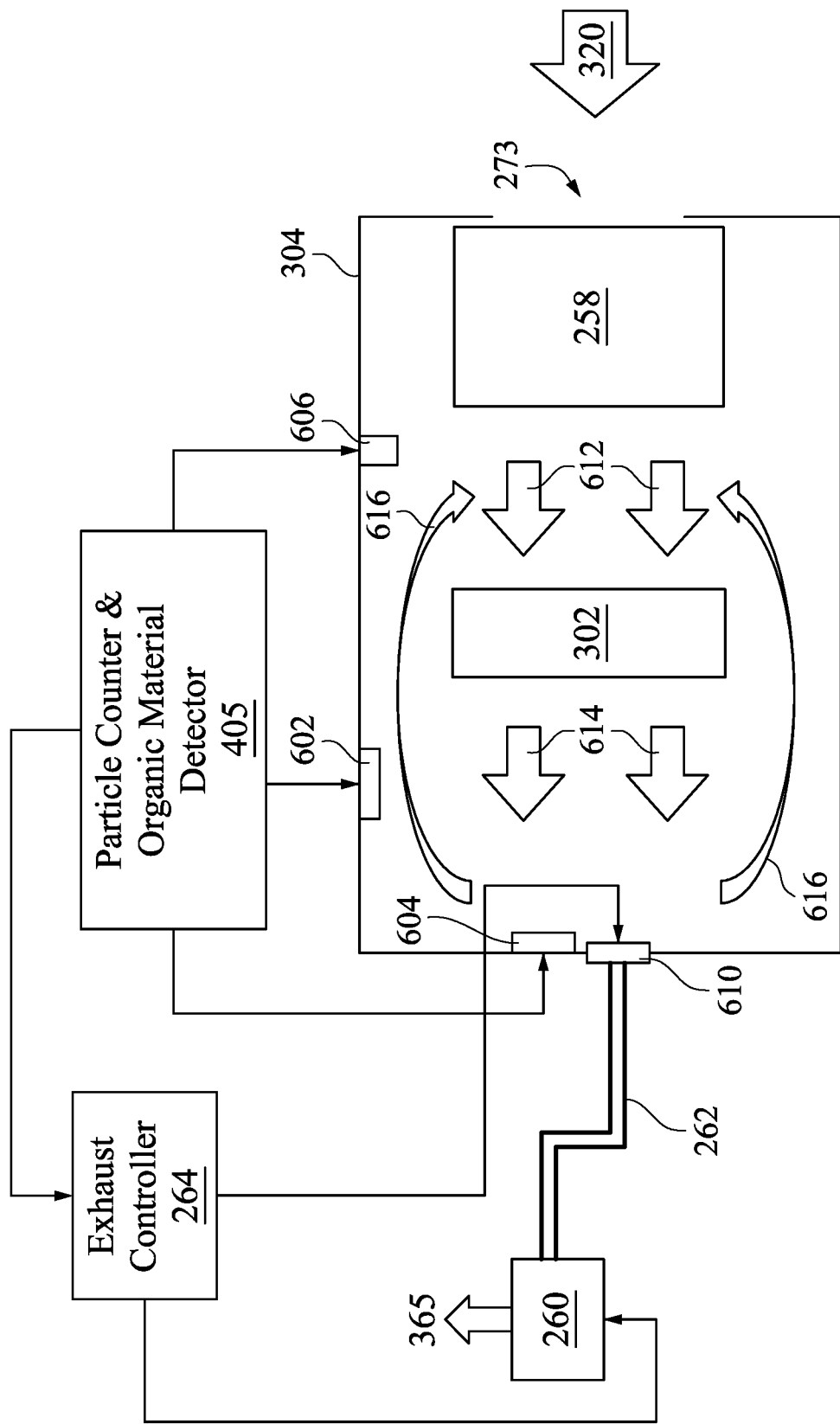
FIG. 6 shows a schematic diagram of a gas extractor chamber in accordance with some embodiments of the present disclosure.

FIG. 6 shows a schematic diagram of a gas extractor chamber in accordance with some embodiments of the present disclosure. FIG. 6 shows the details of exhaust purge chamber 304. As described above the exhaust purge chamber 304 includes a gas extractor systems 258 that extracts, e.g., draws, the stream of gas 320 from the chamber of the device 500 through the opening 273. The extracted stream of gas 320 produces a stream of gas 612 inside the exhaust purge chamber 304. As described above the stream of gas 320 and, thus, the stream of gas 612 may include particles and organic material. The stream of gas 612 goes through the filter system 302 of the exhaust purge chamber 304 and at least part of the particles and the organic material is removed by the filter system 302 and thus a stream of gas 614 after the filter system 302 is less contaminated and includes smaller number of particles compared to the stream of gas 612.

The exhaust purge chamber 304 also includes an organic material sensor 602 and two particle sensors 604 and 606 that are connected to the particle counter and organic material detector 405. The exhaust purge chamber 304 additionally includes a valve 610 that is normally closed and, thus, when the stream of gas 614 reaches the end of the exhaust purge chamber 304, a stream of gas 616 that returns back and joins the stream of gas 612 is produced and is further cleaned by the filter system 302. In some embodiments, the particle counter and organic material detector 405 constantly monitor the exhaust purge chamber 304 for the number of particles and the amount of organic material contamination. When the particle counter and organic material detector 405 determine that the number of particles is below a first threshold and/or the amount of organic material is below a second threshold, the article counter and organic material detector 405 command the exhaust controller 264 to open the valve 610 and let the stream of gas 614 to exit the exhaust purge chamber 304 and enter the exhaust port 260 through the pipe 262 to generate the stream 365 to exit the gas extractor chamber 274 and return via the pipe 375 to the gas tank-gas port 250.

Figure 7D:
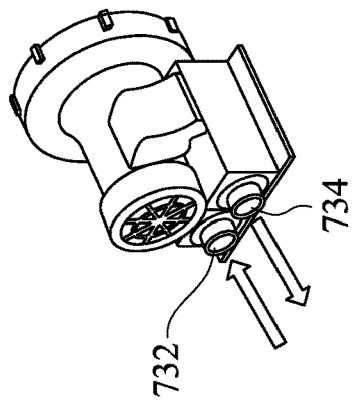
FIGS. 7A, 7B, 7C, 7D and 7E show components of the cleaning system in accordance with some embodiments of the present disclosure.
Figure 7E:
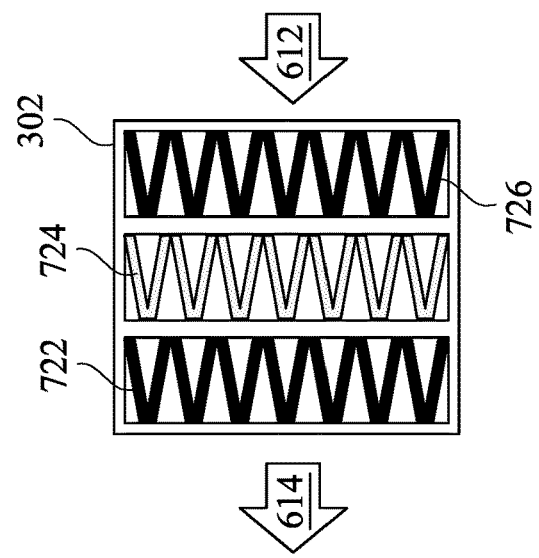
Figure 7C:
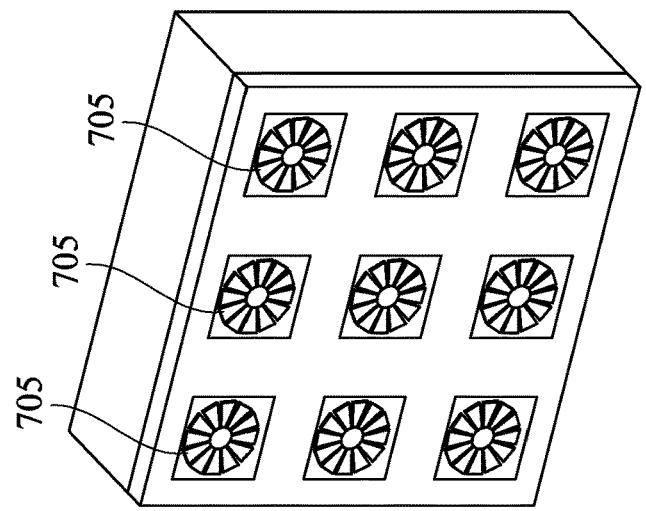
Figure 7A:
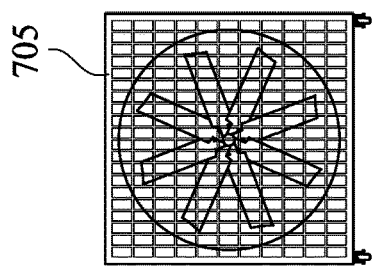
Figure 7B:
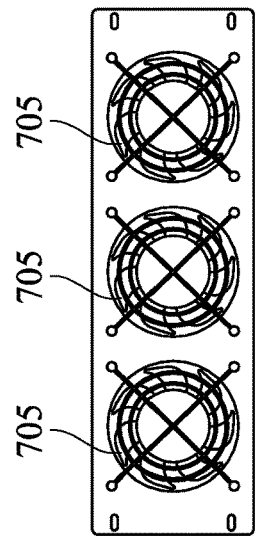
Figure 8C:
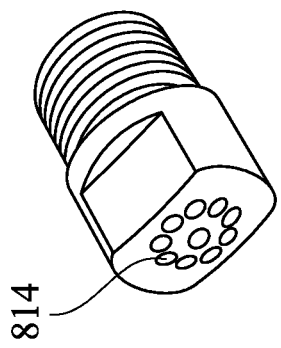
FIGS. 8A, 8B, 8C, 8D, 8E, and 8F show components of the cleaning system in accordance with some embodiments of the present disclosure.
Figure 8F:
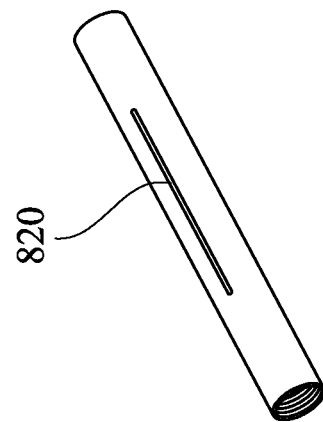
Figure 8B:
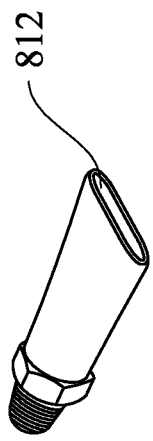
Figure 8E:
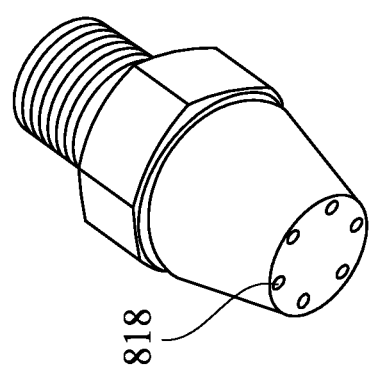
Figure 8A:
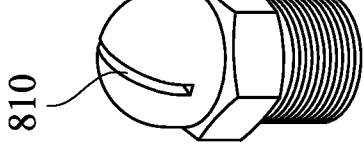
Figure 8D:
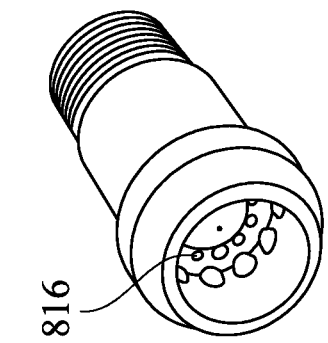

FIGS. 7A, 7B, 7C, and 7D show components of the cleaning system in accordance with some embodiments of the present disclosure. FIGS. 7A, 7B, and 7C respectively show one fan 705, a group of 3 fans 705 and a group of nine fans 705. The fans may be installed in the gas blower system 252 to draw gas from the gas tank-gas port 250 and to produce the stream of gas 310. FIG. 7D is a compressor that may installed in the gas blower system 252 to receive the input gas from the gas tank-gas port 250 through input port 732 and to produce the stream of gas 310 through the output port 734. The fans of FIGS. 7A, 7B, and 7C or the compressor of FIG. 7D may be used in the gas extractor system 258.

FIG. 7E shows a filter system that is consistent with the filter system 302. The filter system of FIG. 7E includes a filter 724 for removing the organic material, e.g., a charcoal filter, a gas filer, HEPA filter, or a Donaldson filter for removing organic material and bases, organic material and acids, or organic gases, a filter 726 for removing small particles, e.g., particles having a width between about 1 nm and about 10 nm, and a fitter 722 for removing the large particles, e.g., particles having a width of more than about 10 nm. In some embodiments, the acids include HF, HBr, $H_2SO_4$, HCl, $H_3PO_4$, $HNO_3$, $CH_3COOH$, or HCOOH and the bases include ammonia, or an amine, e.g., trimethylamine, cyclohexylamine, diethylaminoethanol, methylamine, dimethylamine, ethanolamine, or morpholine. In some embodiments, the organic material includes benzene, toluene, siloxanes, acetone, fluorinated refrigerants, N-methyl-2-pyrrolidone (NMP), trimethylamine (TMA), or dimethylaniline (DMA).

FIGS. 8A, 8B, 8C, 8D, 8E, and 8F show components of the cleaning system in accordance with some embodiments of the present disclosure. FIGS. 8A, 8B, 8C, 8D, 8E, and 8F show different type of nozzles that are consistent with the nozzles 402, 404, 406, 407, 408, and 409. Nozzles 810, 812, and 820 of FIGS. 8A, 8B, and 8F may produce a 1-dimensional (1D) fan shape stream of gas that are consistent with the nozzle 411 of FIG. 5E that can be used for sweeping an area by rotating the nozzle. Nozzles 814, 816, and 818 of FIGS. 8C, 8D, and 8E may produce 2-dimensional (2D) stream of gas that can clean an area.

Figure 9:
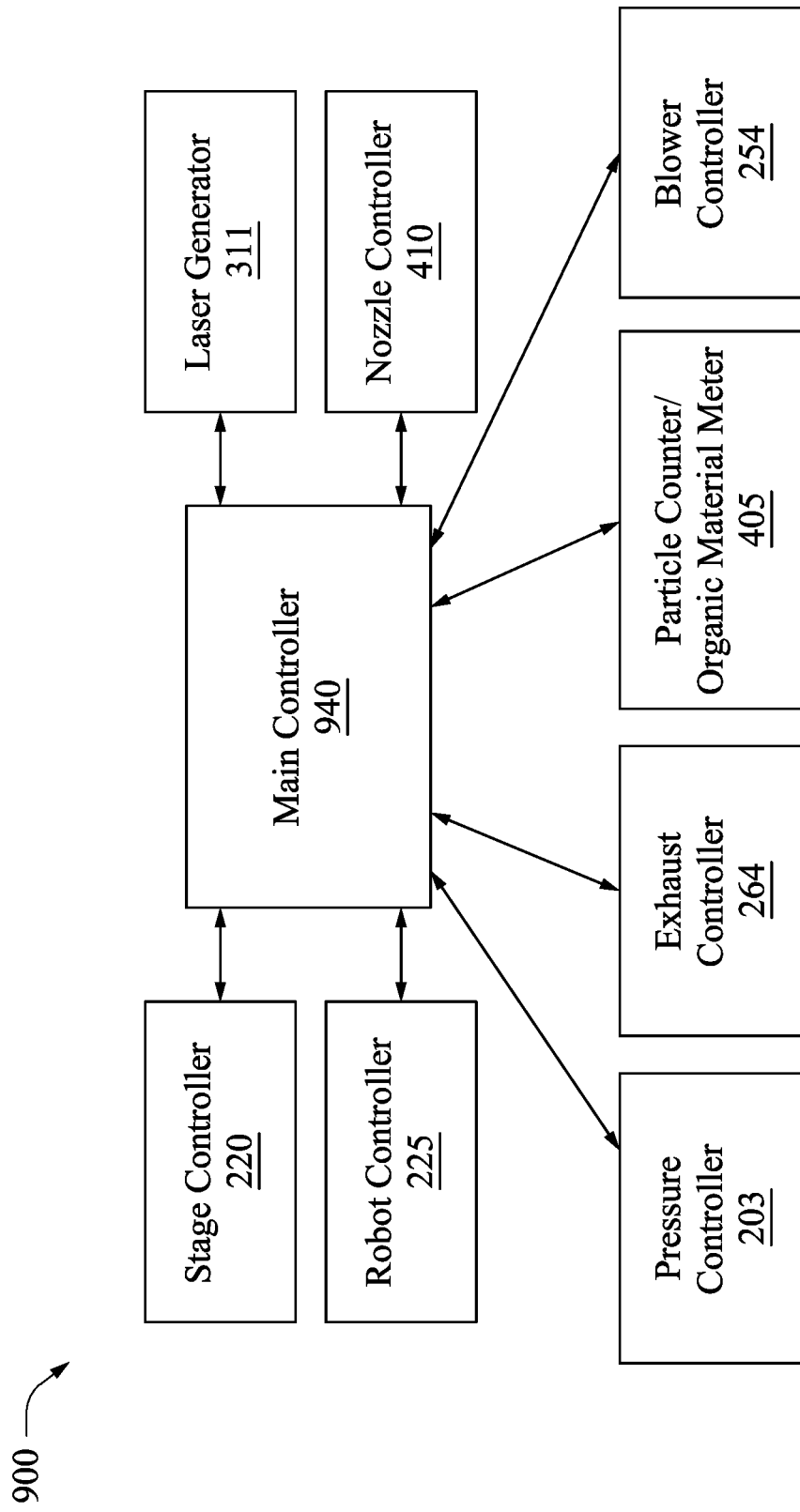
FIG. 9 shows a control system for cleaning the components of a lithography system in accordance with some embodiments of the present disclosure.

FIG. 9 shows a control system 900 for cleaning the components of a lithography system in accordance with some embodiments of the present disclosure. The control system 900 includes a main controller 940. In some embodiments, the control system 900 includes the stage controller 220 and the robot controller 225 of FIG. 3, the pressure controller 203 of FIG. 2A, the exhaust controller 264 and the blower controller 254 of FIGS. 3, 4, 5A, and 6, the particle counter and organic material detector 405 of FIGS. 4, 5A, and 6, the laser generator 311 of FIG. 1, and the nozzle controller 410 of FIGS. 4 and 5A. In some embodiments, the main controller 940 is coupled to and controls the stage controller 220, the robot controller 225, the pressure controller 203, the exhaust controller 264, the blower controller 254, the particle counter and organic material detector 405, the laser generator 311, and the nozzle controller 410. In some embodiments, the blower controller 254 and the nozzle controller 410 are combined into a single unit of the blower-nozzle controller 554.

In some embodiments, the main controller 940 commands the stage controller 220, the robot controller 225, the pressure controller 203, and the laser generator 311 to stop sending the excitation pulse and generating the EUV radiation 29 and stop projecting the photo mask 205 to the wafer 221 in the wafer table 210 and prepare for the cleaning phase, e.g., when the lithography system is in idle mode or during the preventive maintenance. The main controller 940 may command the pressure controller 203 to change the pressure inside the chamber of the wafer table 210 and prepare for the cleaning phase. In some embodiments, the main controller 940 commands the blower controller 254 to send the cleaning gas into a chamber of the wafer table 210 and to increase or decrease the pressure of the cleaning gas. The main controller 940 commands the nozzle controller 410 to rotate the tip of the nozzles of the wafer table 210 and to direct the stream of cleaning gas exiting the tip of the nozzles at different surfaces of the components inside the chamber of the wafer table 210. The main controller 940 commands the exhaust controller 264 to collect the cleaning gas and the particles and the organic material contamination extracted from surfaces of the components inside the chamber of the wafer table 210.

In some embodiments and referring to FIG. 4, the main controller 940 commands the exhaust controller 264 to allow the recycling of the stream of gas 320, using the stream 365 to the chamber of the wafer table 210 via the pipe 375 and the gas tank-gas port 250 when the number of particles is below a first threshold and the amount of organic material is below a second threshold. In some embodiments, the main controller 940 completes the maintenance mode when the number of particles in the stream of gas 320 continuously stays below the first threshold for a predetermined amount of time, of about 5 minutes to about an hour, and the amount of organic material in the stream of gas continuously stays below the second threshold for the predetermined amount of time. In some embodiments, the main controller 940 commands the blower controller 254 to stop the stream of gas 310 and commands the exhaust controller 264 to stop the stream of gas 320. In some embodiments, the main controller 940 commands the blower controller 254 to flow the stream of gas 310 when the main controller 940 commands the exhaust controller 264 to allow the recycling of the stream of gas 320 by sending the stream 365 in the pipe 375. In some embodiments, the purge gas is continuously or periodically, e.g., intermittently, sent during the operation of the lithography system to reduce the preventive maintenance time.

Figure 10:
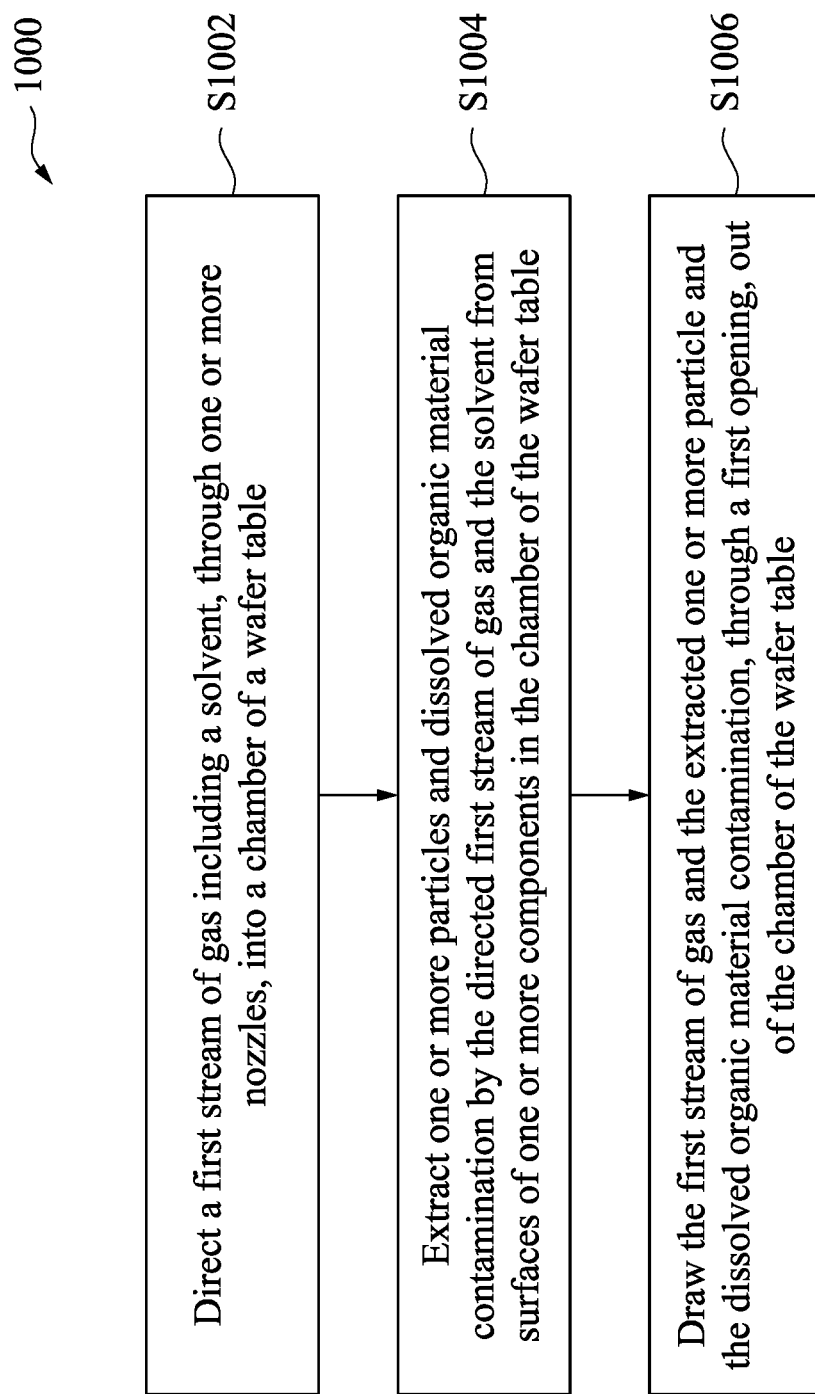
FIG. 10 shows a flow diagram of a process for cleaning the components of a lithography system in accordance with some embodiments of the present disclosure.

FIG. 10 illustrates a flow diagram of a process 1000 for cleaning the components of a lithography system in accordance with some embodiments of the present disclosure. The process 1000 or a portion of the process 1000 may be performed by the system of FIGS. 3, 4, 5A, 5B, 5C, 5D, and 5E. In some embodiments, the process 1000 or a portion of the process 1000 is performed and/or is controlled by the computer system 1100 described below with respect to FIGS. 11A and 11B. In some embodiments, the process 1000 or a portion of the process 1000 is performed by the control system 900 of FIG. 9 described above. The method includes an operation S1002, where a first stream of gas including a solvent is directed, through one or more nozzles, into a chamber of a wafer table. As shown in FIGS. 5C and 5D the stream of gas 310 is directed through the nozzles 402, 404, or 406 into the chamber of the wafer table 210. In some embodiments, the stream of gas 310 includes a solvent from the gas tank-gas port 250. In operation S1004, one or more particles is extracted and organic material contamination is dissolved by the directed first stream of gas and the solvent from surfaces of one or more components in the chamber of the wafer table. As shown in FIG. 5A, the solvent from the gas tank-gas port 250 dissolves the organic material contamination and also helps the stream of gas 310 to remove the particles from the surfaces of the stages 246 and 248, the wafer handling robot 245, the stage controller 220, and the robot controller 225. In some embodiments, the directed stream of gas 310 that includes the solvent also cleans inside of the chamber of the wafer table 210. In operation S1006, the first stream of gas and the extracted one or more particle and the dissolved organic material contamination is drawn, through a first opening, out of the chamber of the wafer table. As shown in FIG. 5A, the stream of gas 320 that includes at least a portion of the stream of gas 310 and the extracted one or more particle and the dissolved organic material contamination is drawn through the opening 273 out of the chamber of the wafer table 210.

Figure 11A:
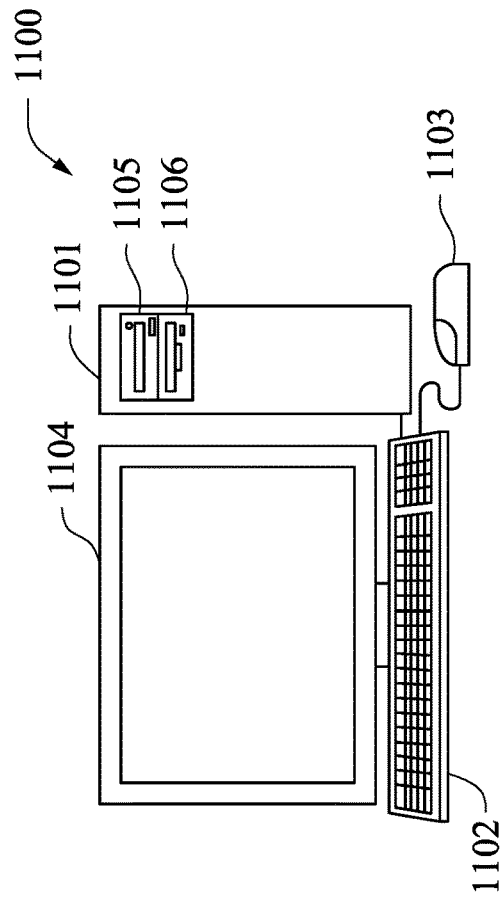
FIGS. 11A and 11B illustrate an apparatus for cleaning the components of a lithography system in accordance with some embodiments of the present disclosure.
Figure 11B:
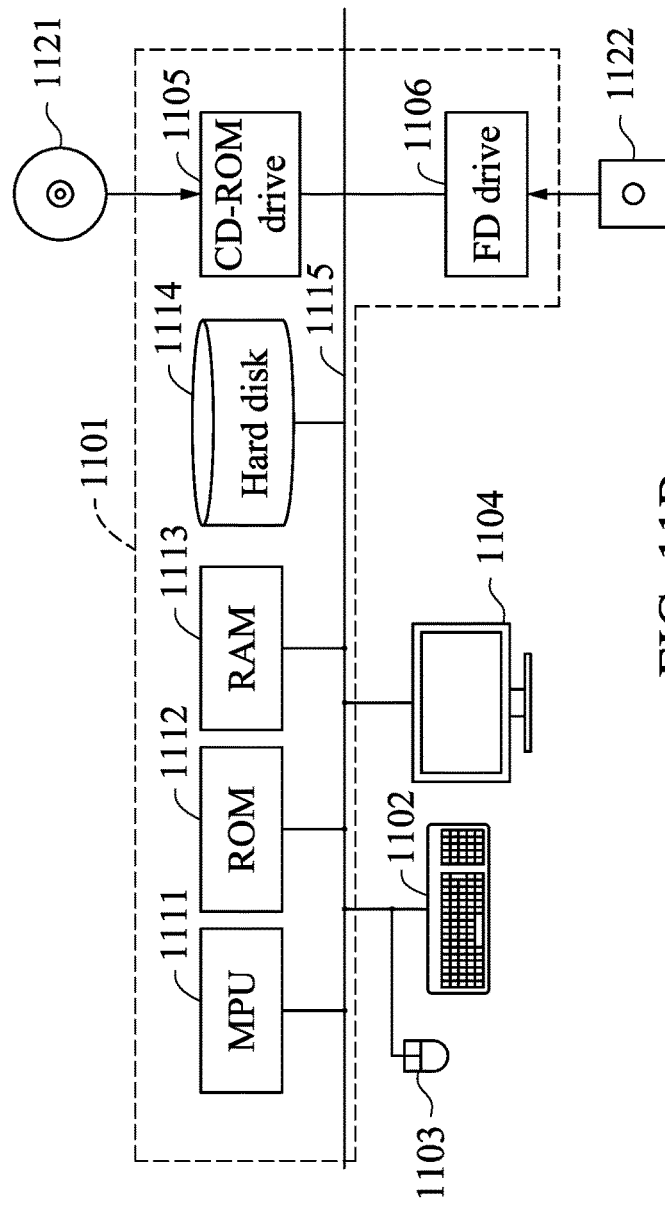

FIGS. 11A and 11B illustrate an apparatus for cleaning the components of a lithography system in accordance with some embodiments of the present disclosure. In some embodiments, the computer system 1100 is used for performing the functions of the modules of FIG. 9 that include the main controller 940, the stage controller 220, the robot controller 225, the pressure controller 203, the exhaust controller 264, the blower controller 254, and the nozzle controller 410.

FIG. 11A is a schematic view of a computer system that performs the functions of an apparatus for cleaning the components of the lithography system. All of or a part of the processes, method and/or operations of the foregoing embodiments can be realized using computer hardware and computer programs executed thereon. In FIG. 11A, a computer system 1100 is provided with a computer 1101 including an optical disk read only memory (e.g., CD-ROM or DVD-ROM) drive 1105 and a magnetic disk drive 1106, a keyboard 1102, a mouse 1103, and a monitor 1104.

FIG. 11B is a diagram showing an internal configuration of the computer system 1100. In FIG. 11B, the computer 1101 is provided with, in addition to the optical disk drive 1105 and the magnetic disk drive 1106, one or more processors, such as a micro processing unit (MPU) 1111, a ROM 1112 in which a program such as a boot up program is stored, a random access memory (RAM) 1113 that is connected to the MPU 1111 and in which a command of an application program is temporarily stored and a temporary storage area is provided, a hard disk 1114 in which an application program, a system program, and data are stored, and a bus 1115 that connects the MPU 1111, the ROM 1112, and the like. Note that the computer 1101 may include a network card (not shown) for providing a connection to a LAN.

The program for causing the computer system 1100 to execute the functions for cleaning the components of the lithography system in the foregoing embodiments may be stored in an optical disk 1121 or a magnetic disk 1122, which are inserted into the optical disk drive 1105 or the magnetic disk drive 1106, and transmitted to the hard disk 1114. Alternatively, the program may be transmitted via a network (not shown) to the computer 1101 and stored in the hard disk 1114. At the time of execution, the program is loaded into the RAM 1113. The program may be loaded from the optical disk 1121 or the magnetic disk 1122, or directly from a network. The program does not necessarily have to include, for example, an operating system (OS) or a third party program to cause the computer 1101 to execute the functions of the control system for cleaning the components of the lithography system in the foregoing embodiments. The program may only include a command portion to call an appropriate function (module) in a controlled mode and obtain desired results.

According to some embodiments of the present disclosure, a method of cleaning a lithography system, during idle mode, includes directing a stream of air, through a first opening, onto one or more wafer chucks in a chamber of a wafer table of an EUV lithography system. The wafer table is housed in a vacuum chamber. The method includes extracting one or more particles by the directed stream of air from surfaces of one or more wafer chucks in the chamber of the wafer table. The method also includes drawing the stream of air and the extracted one or more particle, through a second opening, out of the chamber of the wafer table. In an embodiment, the method further includes generating the stream of air by a first air conducting system coupled to the chamber of the wafer table. The first air conducting system is connected to the first opening. In an embodiment, the method further includes drawing the stream of air and the extracted one or more particles by a second air conducting system coupled the chamber of the wafer table. The second air conducting system is connected to the second opening. In an embodiment, the method further includes directing, by the second air conducting system, the stream of air and the extracted one or more particles through an air filter system outside the chamber of the wafer table at the second opening, collecting the one or more particles by the air filter system to clean the stream of air, and recycling the cleaned stream of air through the first opening into the chamber of the wafer table. In an embodiment, the method further includes directing the stream of air, through one or more nozzles, at the first opening, directing the stream of air at a plurality of locations of the surfaces of the one or more wafer chucks by moving the one or more nozzles to change a direction of the stream of air, and adjusting a flow rate of the stream of air. In an embodiment, the stream of air includes a solvent carried by the stream of air and the air filter system includes two or more air filters, the method further includes dissolving organic material contamination on the surfaces of one or more wafer chucks by the solvent. The organic material contamination is carried by the stream of air. And extracting the organic material contamination by one of the two or more air filters. In an embodiment at least one of the nozzles is mounted above a first wafer chuck of the one or more wafer chucks, the method further includes directing the stream of air from top on the first wafer chuck.

According to some embodiments of the present disclosure, a method of cleaning a lithography system includes directing a first stream of gas that includes a solvent, through one or more nozzles, into a chamber in a lithography system when the lithography system is in maintenance mode. The method includes extracting one or more particles and dissolving organic material contamination by the directed first stream of gas from surfaces of one or more components in chamber of the lithography system. The method also includes drawing the first stream of gas that includes the extracted one or more particles and the dissolved organic material contamination, through a first opening, out of the chamber of the lithography system. The method further includes maintaining a temperature of the chamber at a temperature during normal operation of the lithography system. In an embodiment, the chamber is a chamber of a wafer table of the lithography system, a chamber of an exposure device of the lithography system, or a chamber of a mask handling system of the lithography system, and the one or more components includes one or more of wafer chucks, one or more wafer handling robots, one or more mask handling robots, and one or more mirrors. In an embodiment, the method further includes rotating the one or more nozzles in a vertical direction and in a plane perpendicular to the vertical direction to sweep the chamber and to sweep the one or more components in the chamber. In an embodiment, the method further includes generating a stream of gas by a first gas conducting system, and combining the stream of gas with a vaporized form of the solvent to produce the first stream of gas. In an embodiment, the method further includes drawing the first stream of gas, by a second gas conducting system coupled the chamber, directing, by the second gas conducting system, the first stream of gas through a gas filter system coupled the chamber at the first opening, collecting the one or more particles by a first filter of the gas filter system and collecting the dissolved organic material contamination by a second filter of the gas filter system to clean the first stream of gas, and recycling the cleaned first stream of gas into the chamber. In an embodiment, the method further includes continuously monitoring a number of particles and an amount of the organic material in the first stream of gas after the gas filter system, recycling the cleaned first stream of gas into the chamber when the number of particles in the first stream of gas is below a first threshold and the amount of organic material in the first stream of gas is below a second threshold, and automatically ending the maintenance mode when the number of particles in the first stream of gas continuously stays below the first threshold for a predetermined amount of time and the amount of organic material in the first stream of gas continuously stays below the second threshold for the predetermined amount of time. In an embodiment a first nozzle is mounted above the one or more components, the method further includes directing a second stream of gas at an angle of about 45 degrees with the vertical direction out of the first nozzle, and rotating an end of the first nozzle in an area in the plane perpendicular to the vertical direction.

According to some embodiments of the present disclosure, a system for cleaning a lithography system includes a main controller, a wafer table of an EUV lithography system that has a chamber that comprises one or more wafer chucks and one or more wafer handling robots, a gas source, a first gas conducting system coupled to a first opening of the chamber of the wafer table, and a second gas conducting system coupled to a second opening of the chamber of the wafer table. The main controller is configured to, during a maintenance mode: direct a stream of gas from the gas source, through the first opening, into the chamber of the wafer table where the stream of gas extracts one or more particles from surfaces of the one or more wafer chucks and the one or more wafer handling robots in the chamber of the wafer table, and draw the stream of gas and the extracted one or more particle, through the second opening, out of the chamber of the wafer table. In an embodiment, the system further includes a nozzle controller coupled to the main controller and one or more nozzles mounted at the first opening of the chamber of the wafer table. The main controller commands the nozzle controller to rotate one or more tips of the one or more nozzles to direct the stream of gas exiting from the one or more nozzles at a plurality of locations of the surfaces of the one or more wafer chucks and the one or more wafer handling robots. In an embodiment, the first gas conducting system further includes a blow controller coupled to the main controller. The main controller commands the blow controller to adjust a flow rate of the stream of gas by adjusting the first gas conducting system. In an embodiment, the second gas conducting system further includes an exhaust controller coupled to the main controller and the main controller commands the exhaust controller to adjust a flow rate of the second gas conducting system that draws the stream of gas from the second opening out of the chamber of the wafer table. In an embodiment, the second gas conducting system further includes a particle counter-organic material detector coupled to the main controller. The main controller commands the particle counter-organic material detector to continuously monitor a number of particles and an amount of organic material in the stream of gas. The main controller commands the exhaust controller to allow recycling of the stream of gas to the chamber of the wafer table via the first gas conducting system when the number of particles is below a first threshold and the amount of organic material is below a second threshold. The main controller completes the maintenance mode when the number of particles in the stream of gas continuously stays below the first threshold for a predetermined amount of time and the amount of organic material in the stream of gas continuously stays below the second threshold for the predetermined amount of time.

As described in the foregoing embodiments, the lithography system or a device of the lithography system is cleaned without removing the components and fixtures and, thus, without requiring a full calibration of the devices of the lithography system after the cleaning. Therefore, a good amount a time is saved during the preventive maintenance and the utilization of the lithography system is increased from 95 percent to 97.5 percent.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
during idle mode:
directing one or more pressurized jets of air, entering through a first opening into a chamber of a wafer table of an EUV lithography system, to impinge onto walls and one or more wafer chucks in the chamber;
extracting one or more particles by the one or more pressurized jet of air from surfaces of the walls and the one or more wafer chucks in the chamber of the wafer table;
drawing the extracted one or more particle and the entered one or more jets of air, through a second opening, out of the chamber of the wafer table;
directing the entered air and the extracted one or more particles as a first stream of air through an air filter system outside the chamber of the wafer table at the second opening;
collecting the one or more particles by the air filter system to clean the first stream of air;
detecting a number of particles in the cleaned first stream of air after the air filter system; and
recycling the cleaned first stream of air through the first opening into the chamber of the wafer table when the number of particles in the first stream of air is below a first threshold.

2. The method of claim 1, wherein the one or more pressurized jets of air are generated by a first air conducting system, the method further comprising:
drawing the extracted one or more particles and the entered air by a second air conducting system coupled the chamber of the wafer table, wherein the second air conducting system is connected to the second opening.

3. The method of claim 1, wherein the one or more pressurized jets of air comprises a solvent carried by the one or more pressurized jets of air, and wherein the air filter system comprises two or more air filters, the method further comprising:
dissolving organic material contamination on the walls and surfaces of the one or more wafer chucks by the solvent, wherein the organic material contamination is carried by the first stream of air through the air filter system; and
extracting the organic material contamination by one of the two or more air filters.

4. The method of claim 1, further comprising:
directing two or more pressurized jets of air, through two or more nozzles that are arranged at two or more different directions, at the first opening;
directing the two or more pressurized jets of air at a plurality of locations of the walls and the surfaces of the one or more wafer chucks by moving the two or more nozzles to change two or more directions of the pressurized jets of air; and
adjusting flow rates of the two or more pressurized jets of air.

5. The method of claim 4, wherein at least a first nozzle of the two or more nozzles is mounted above a first wafer chuck of the one or more wafer chucks, the method comprising:
directing the pressurized jet of air from the first nozzle to a top of the first wafer chuck.

6. The method of claim 1, further comprising:
directing a fan shape stream of air through a linear nozzle over one or more components in the chamber.

7. The method of claim 1, wherein the pressurized jet of air includes hydrogen or oxygen radicals.

8. A method, comprising:
directing a first stream of gas comprising a solvent, through one or more nozzles, into a chamber in a lithography system when the lithography system is in maintenance mode;
extracting one or more particles by the first stream of gas that impinges on walls and one or more components of the chamber of the lithography system and dissolving organic material contamination by the solvent in the directed first stream of gas from surfaces of one or more components in the chamber of the lithography system;
drawing the first stream of gas that comprises the extracted one or more particles and the dissolved organic material contamination, through a first opening, out of the chamber of the lithography system;
directing the first stream of gas through a gas filter system coupled the chamber at the first opening;
collecting the one or more particles by a first filter of the gas filter system and collecting the dissolved organic material contamination by a second filter of the gas filter system to clean the first stream of gas;
continuously monitoring a number of particles and an amount of the organic material in the first stream of gas after the gas filter system;
recycling the cleaned first stream of gas into the chamber when the number of particles in the first stream of gas is below a first threshold and the amount of organic material in the first stream of gas is below a second threshold; and
maintaining a temperature of the chamber at a temperature close to a temperature of the lithography system during normal operation of the lithography system.

9. The method of claim 8, wherein a first nozzle of the one or more nozzles is mounted above one of the one or more components, the method further comprising:
directing a pressurized jet of gas, at an angle of about 45 degrees with a vertical direction, out of the first nozzle; and
rotating an end of the first nozzle in an area in a plane perpendicular to the vertical direction.

10. The method of claim 8, further comprising:
generating a second stream of gas by a first gas conducting system; and
combining the second stream of gas with a vaporized form of the solvent to produce the first stream of gas.

11. The method of claim 8, further comprising:
drawing the first stream of gas, by a second gas conducting system coupled the chamber.

12. The method of claim 11, further comprising:
automatically ending the maintenance mode when the number of particles in the first stream of gas continuously stays below the first threshold for a predetermined amount of time and the amount of organic material in the first stream of gas continuously stays below the second threshold for the predetermined amount of time.

13. The method of claim 8, wherein the first stream of gas comprises a plurality of streams of gas that include first, second and more streams of gas, which are pressurized jets of gas each directed by separate nozzles at different angles.

14. A system, comprising:
a main controller;
a wafer table of an EUV lithography system comprising a chamber that comprises one or more wafer chucks and one or more wafer handling robots;

a gas source;

a first gas conducting system coupled to a first opening of the chamber of the wafer table;

a second gas conducting system coupled to a second opening of the chamber of the wafer table that comprises a particle counter-organic material detector coupled to the main controller; and an exhaust controller coupled to the main controller, wherein the main controller is configured to, during a maintenance mode:

direct a first stream of gas from the gas source, through the first opening, into the chamber of the wafer table, wherein the first stream of gas is configured to impinge on surfaces of walls and the one or more wafer chucks and the one or more wafer handling robots in the chamber of the wafer table to extract one or more particles from surfaces;

draw the first stream of gas and the extracted one or more particle, through the second opening, out of the chamber of the wafer table;

command the particle counter-organic material detector to continuously monitor a number of particles and an amount of organic material in the first stream of gas; and command the exhaust controller to allow recycling of the first stream of gas to the chamber of the wafer table via the first gas conducting system when the number of particles is below a first threshold and the amount of organic material is below a second threshold.

15. The system of claim 14, wherein the gas source comprises a vaporized form of a solvent, wherein the first stream of gas is configured to decompose organic material from the surfaces of the walls and the one or more wafer chucks and the one or more wafer handling robots.

16. The system of claim 14, wherein the first gas conducting system further comprises:

a nozzle controller coupled to the main controller; and one or more nozzles mounted at the first opening of the chamber of the wafer table, wherein the main controller is configured to command the nozzle controller to rotate one or more tips of the one or more nozzles to direct the first stream of gas exiting from the one or more nozzles at a plurality of locations on the surfaces of the one or more wafer chucks and the one or more wafer handling robots.

17. The system of claim 14, wherein the main controller is configured to command the exhaust controller to adjust a flow rate of the second gas conducting system that draws the first stream of gas from the second opening out of the chamber of the wafer table.

18. The system of claim 17, wherein the main controller is configured to complete the maintenance mode when the number of particles in the first stream of gas continuously stays below the first threshold for a predetermined amount of time and the amount of organic material in the first stream of gas continuously stays below the second threshold for the predetermined amount of time.

19. The system of claim 14, further comprising:

a third gas conducting system coupled to a linear nozzle at a third opening of the chamber of the wafer table, wherein during the maintenance mode the main controller is configured to direct a second fan shape stream of gas through the linear nozzle onto the surfaces.

* * * * *